United States Patent
Sakui et al.

(10) Patent No.: US 11,682,443 B2
(45) Date of Patent: Jun. 20, 2023

(54) SEMICONDUCTOR ELEMENT MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/713,813

(22) Filed: Apr. 5, 2022

(65) Prior Publication Data
US 2022/0319566 A1     Oct. 6, 2022

(30) Foreign Application Priority Data

Apr. 6, 2021   (WO) ................. PCT/JP2021/014598

(51) Int. Cl.
*G11C 11/404*     (2006.01)
*G11C 11/4096*    (2006.01)
*H10B 12/00*      (2023.01)

(52) U.S. Cl.
CPC ........ *G11C 11/404* (2013.01); *G11C 11/4096* (2013.01); *H10B 12/20* (2023.02)

(58) Field of Classification Search
CPC .... G11C 11/404; G11C 11/2273; H10B 12/20
See application file for complete search history.

(56) References Cited

U.S. PATENT DOCUMENTS 5,473,563 A * 12/1995 Suh ................ G11C 16/12
                                              365/185.13
5,677,867 A * 10/1997 Hazani ............ G11C 16/08
                                              257/E27.103
(Continued)

FOREIGN PATENT DOCUMENTS

JP    H 02-188966 A     7/1990
JP    H 03-171768 A     7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).
(Continued)

*Primary Examiner* — Tuan T Nguyen
(74) *Attorney, Agent, or Firm* — Crowell & Moring LLP

(57) ABSTRACT

A memory device includes a page made of a plurality of memory cells arranged in rows on a substrate. A page write operation is performed, during which, in each of the memory cells included in the page, a first voltage V1 is applied to a first drive control line PL, a second voltage V2 is applied to a word line WL, a third voltage V3 is applied to a source line SL, a fourth voltage V4 is applied to a bit line BL, a group of holes generated by an impact ionization phenomenon is retained in an inside of the channel semiconductor layer. A page erase operation is performed, during which the voltages to be applied to the first drive control line PL, the word line WL, the source line SL, and the bit line BL are controlled to discharge the group of holes from the inside of the channel semiconductor layer, and the voltage of the channel semiconductor layer is decreased. A page read operation is performed, during which a fifth voltage V5 that is lower than the first voltage V1 is applied to the first drive (Continued)

control line PL, a sixth voltage V6 that is lower than the second voltage V2 is applied to the word line WL, the third voltage V3 is applied to the source line, and a seventh voltage V7 that is lower than the fourth voltage V4 is applied to the bit line.

14 Claims, 18 Drawing Sheets

(56) References Cited

U.S. PATENT DOCUMENTS

| | | |
|---|---|---|
| 2002/0114191 A1 | 8/2002 | Iwata et al. |
| 2003/0111681 A1 | 6/2003 | Kawanaka |
| 2006/0198216 A1* | 9/2006 | Park .................... G11C 16/0458 257/E21.679 |
| 2007/0012988 A1* | 1/2007 | Bhattacharyya ... G11C 16/0483 257/314 |
| 2008/0137394 A1 | 6/2008 | Shimano |
| 2011/0116316 A1 | 5/2011 | Ueda |
| 2012/0018797 A1* | 1/2012 | Yu ........................ H01L 29/7881 257/324 |

FOREIGN PATENT DOCUMENTS

| | | |
|---|---|---|
| JP | 2003-086712 A | 3/2003 |
| JP | 2003-188279 A | 7/2003 |
| JP | 3957774 B2 | 8/2007 |
| JP | 2008-147514 A | 6/2008 |
| WO | WO 2009-090892 | 7/2009 |

OTHER PUBLICATIONS

H. Chung, H. Kim, H. Kim, K. Kim, S. Kim, K. Dong, J. Kim, Y.C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No 12, December, pp. 2201-2227 (2010).
T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).
M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).
J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).
E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.
J. Y. Song, W. Y. Choi, J. H. Park, J. D. Lee, and B-G. Park: "Design Optimization of Gate-AII-Around (GAA) MOSFETs," IEEE Trans. Electron Devices, vol. 5, No. 3, pp. 186-191, May 2006.
N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.
H. Jiang, N. Xu, B. Chen, L. Zeng1, Y. He, G. Du, X. Liu and X. Zhang: "Experimental investigation of self heating effect (SHE) in multiple-fin SOI F inFETs," Semicond. Sci. Technol. 29 (2014) 115021 (7pp).
F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI,"IEICE Trans. Electron., vol. E90-C., No. 4 pp. 765-771 (2007).
Initial Patent Examination Report from PCT/JP2021/014598, dated Apr. 6, 2021, 5 pgs.

* cited by examiner

FIG.2A 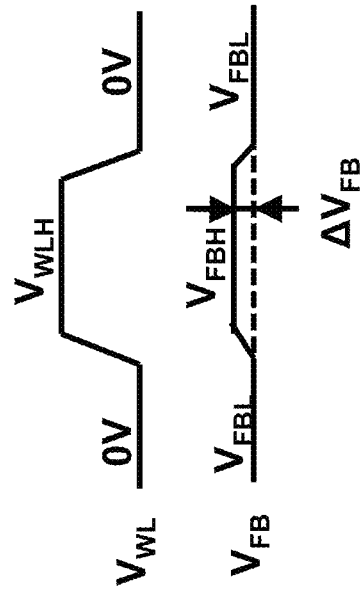

FIG.2B 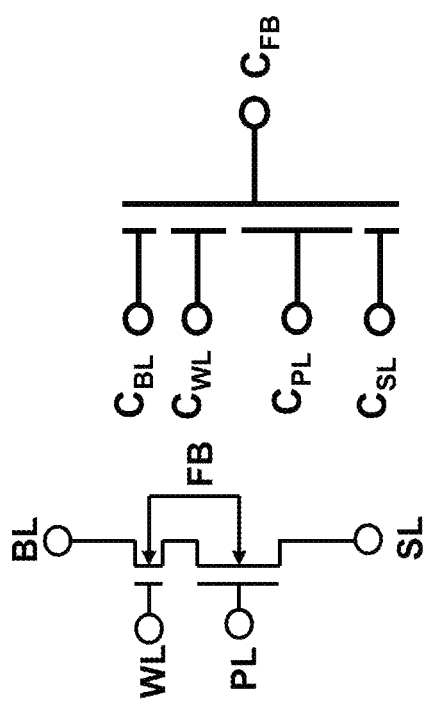

FIG.2C 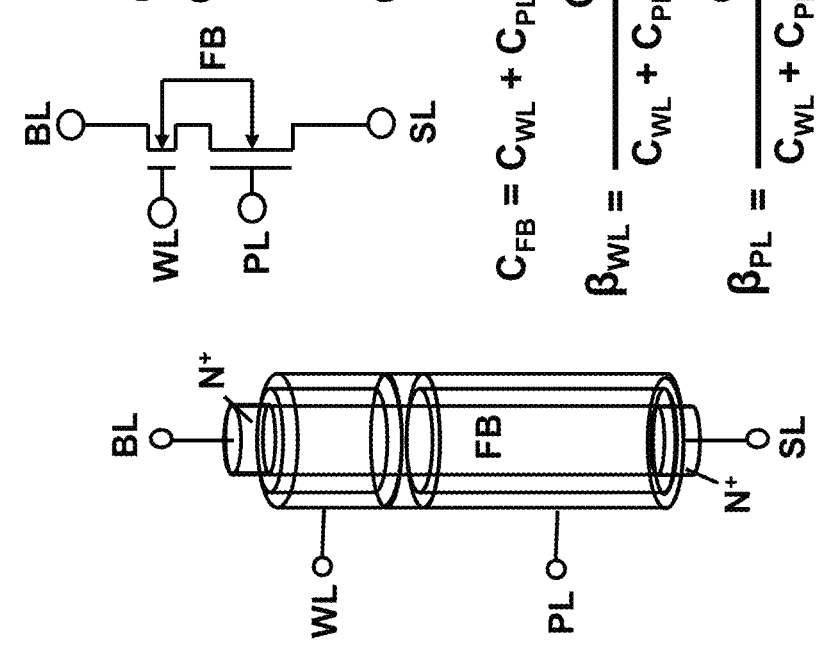

$$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \Rightarrow \text{SMALL}$$

$$\beta_{PL} = \frac{C_{PL}}{C_{WL} + C_{PL} + C_{BL} + C_{SL}} \quad (3) \Rightarrow \text{LARGE}$$

$$\beta_{BL} = \frac{C_{BL}}{C_{WL} + C_{PL} + C_{BL} + C_{SL}} \quad (4) \Rightarrow \text{SMALL}$$

$$\beta_{SL} = \frac{C_{SL}}{C_{WL} + C_{PL} + C_{BL} + C_{SL}} \quad (5) \Rightarrow \text{SMALL}$$

$$\Delta V_{FB} = V_{FBH} - V_{FBL}$$
$$= \beta_{WL} \times V_{WLH} \quad (6)$$
$$\text{SMALL}$$

$$V_{FB}"1" = Vb - \beta_{WL} \times Vt_{WL}"1" - \beta_{BL} \times V_{BLH} \quad (7)$$

SMALL

"1" WRITE OPERATION
SOURCE SIDE IMPACT IONIZATION

"1" WRITE STATE

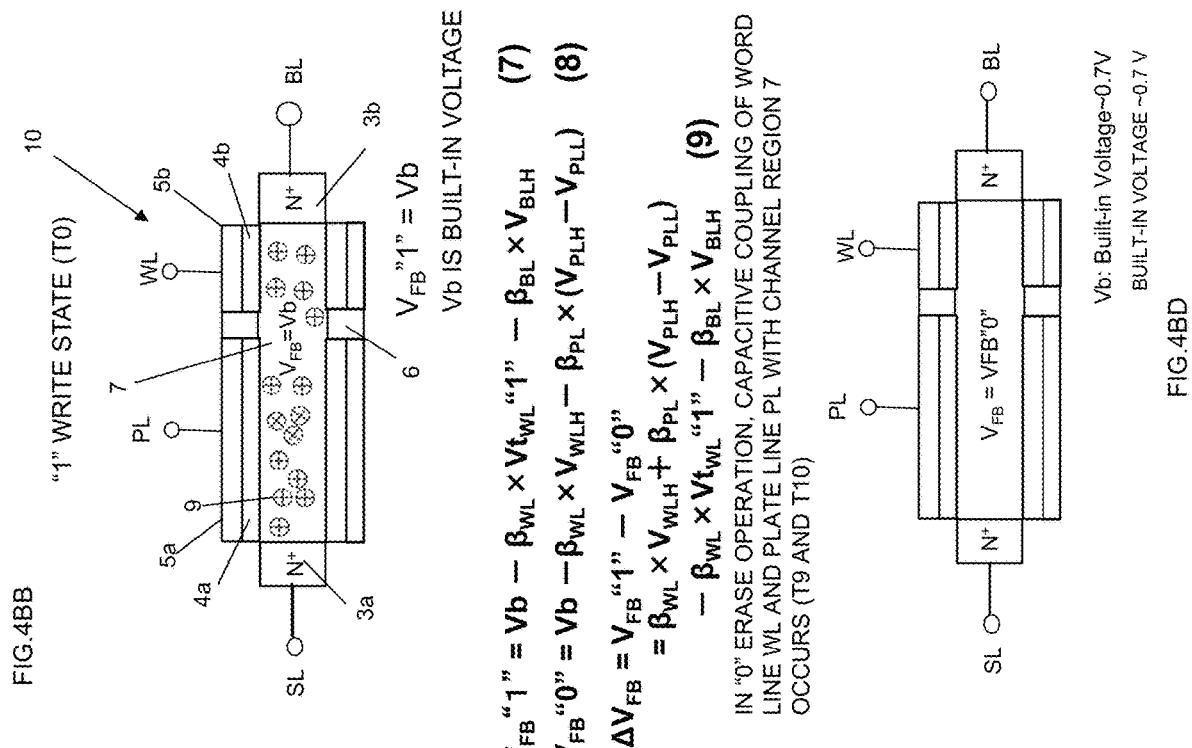
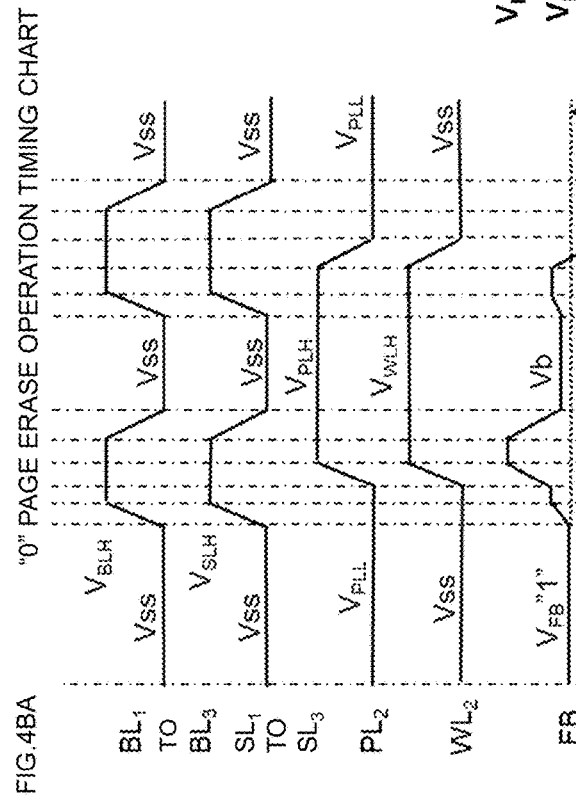
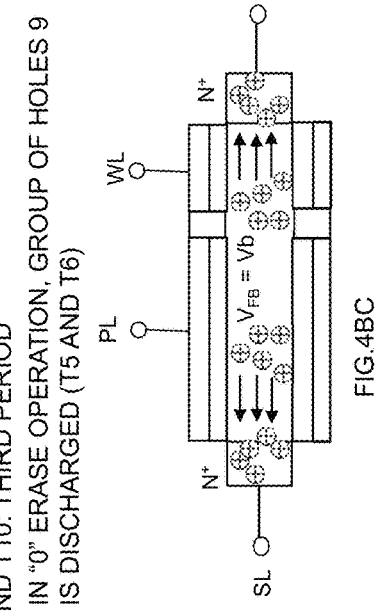

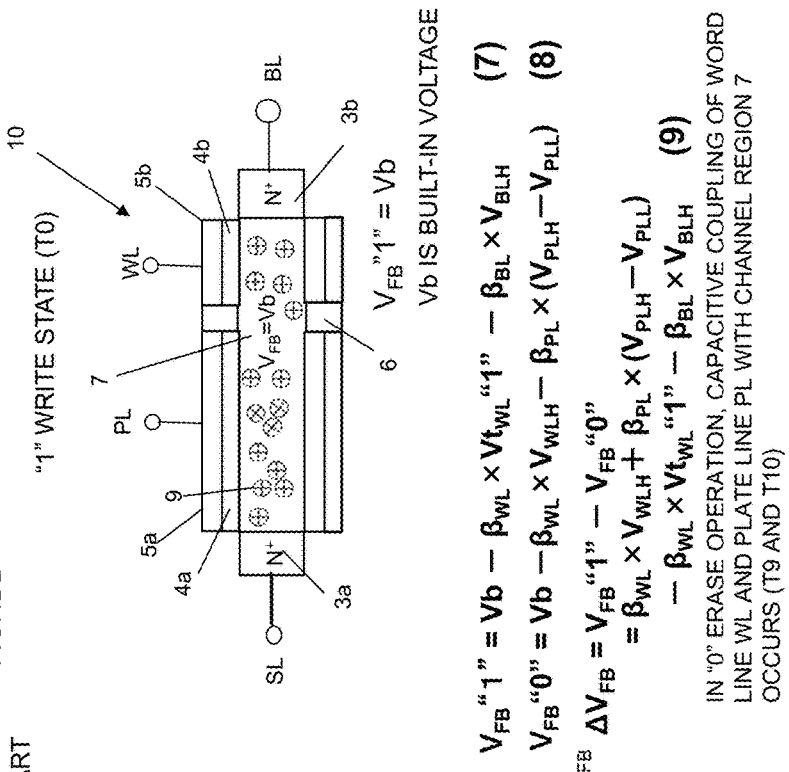

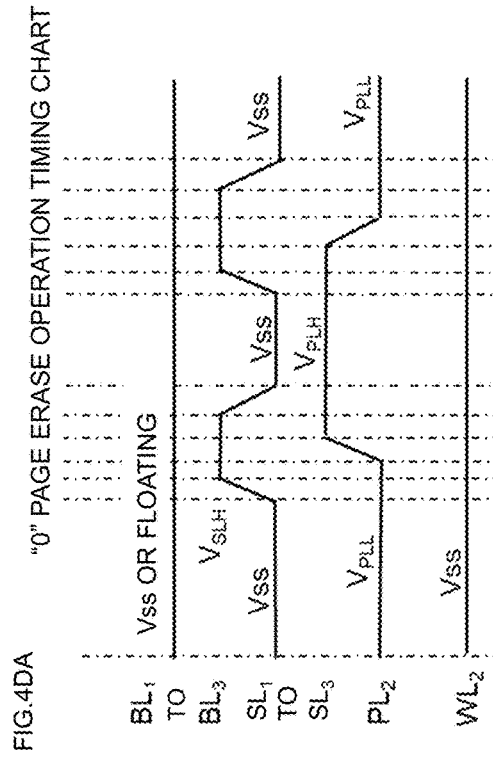

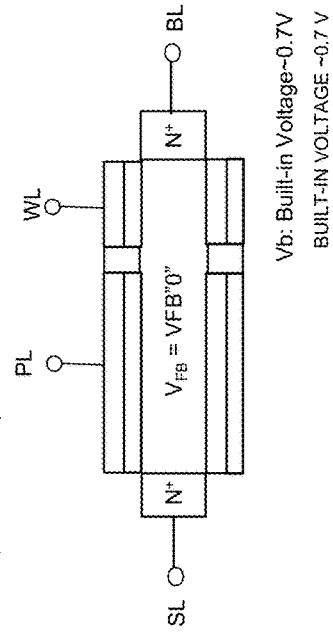

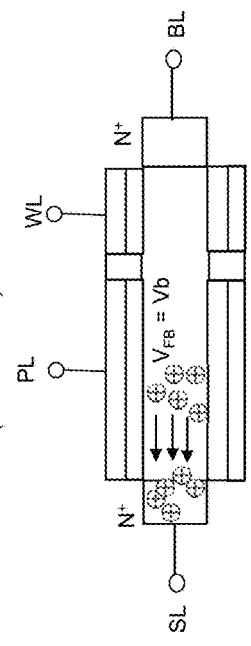

FIG.4DC  FIG.4DD $$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\Delta V_{FB} = V_{FB}\text{"1"} - V_{FB}\text{"0"}$$
$$= \beta_{WL} \times V_{WLH} + \beta_{PL} \times (V_{PLH} - V_{PLL})$$
$$- \beta_{WL} \times Vt_{WL}\text{"1"} - \beta_{BL} \times V_{BLH} \quad (9)$$

IN "0" ERASE OPERATION, CAPACITIVE COUPLING OF WORD LINE WL AND PLATE LINE PL WITH CHANNEL REGION 7 OCCURS (T9 AND T10)

T3 AND T4: FIRST PERIOD
T5 AND T6: SECOND PERIOD
T9 AND T10: THIRD PERIOD

IN "0" ERASE OPERATION, GROUP OF HOLES 9 IS DISCHARGED (T5 AND T6)

FIG.4EA

"0" PAGE ERASE OPERATION TIMING CHART

T3 AND T4: FIRST PERIOD
T5 AND T6: SECOND PERIOD
T9 AND T10: THIRD PERIOD

IN "0" ERASE OPERATION, GROUP OF HOLES 9 IS DISCHARGED (T5 AND T6)

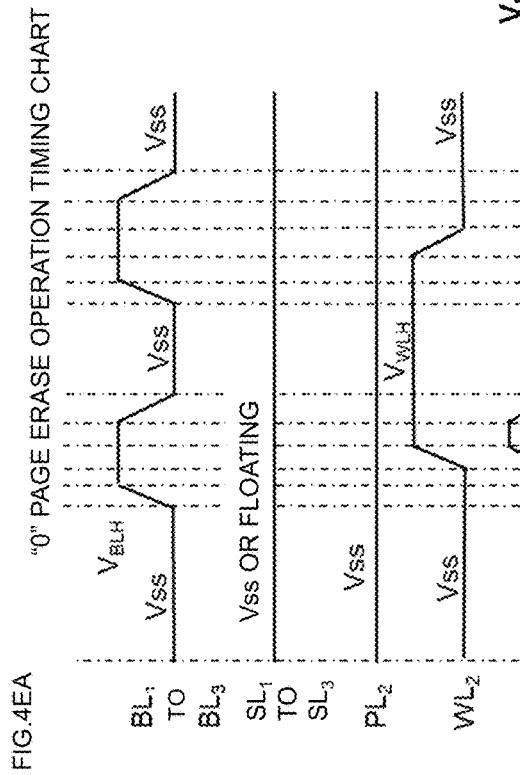

FIG.4EB

"1" WRITE STATE (T0)

$V_{FB}\text{"1"} = V_b$

Vb IS BUILT-IN VOLTAGE $V_{FB}\text{"1"} = V_b - \beta_{WL} \times Vt_{WL}\text{"1"} - \beta_{BL} \times V_{BLH}$ (7)

$V_{FB}\text{"0"} = V_b - \beta_{WL} \times V_{WLH} - \beta_{PL} \times (V_{PLH} - V_{PLL})$ (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL}) - \beta_{WL} \times Vt_{WL}\text{"1"} - \beta_{BL} \times V_{BLH}$ (9)

IN "0" ERASE OPERATION, CAPACITIVE COUPLING OF WORD LINE WL AND PLATE LINE PL WITH CHANNEL REGION 7 OCCURS (T9 AND T10)

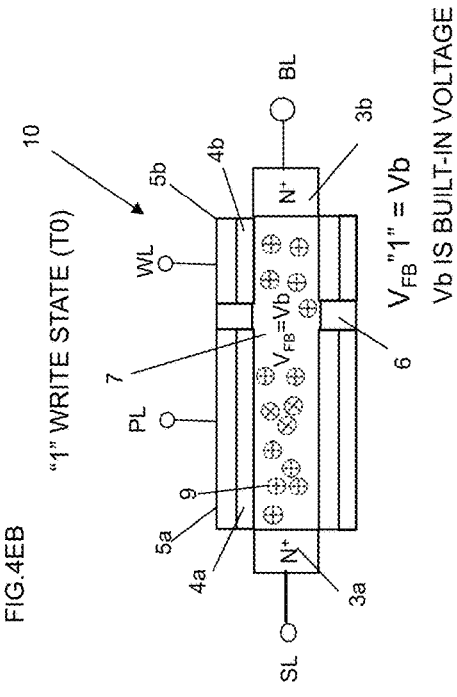

FIG.4EC

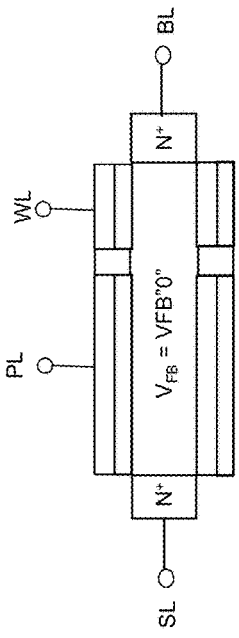

FIG.4ED

Vb: Built-in Voltage~0.7V
BUILT-IN VOLTAGE ~0.7 V $V_{FB} = V_{FB}\text{"0"}$

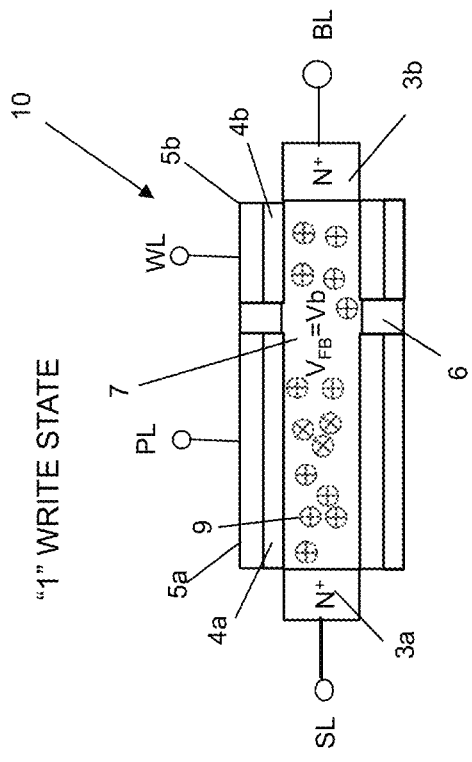
FIG.5A "1" WRITE STATE
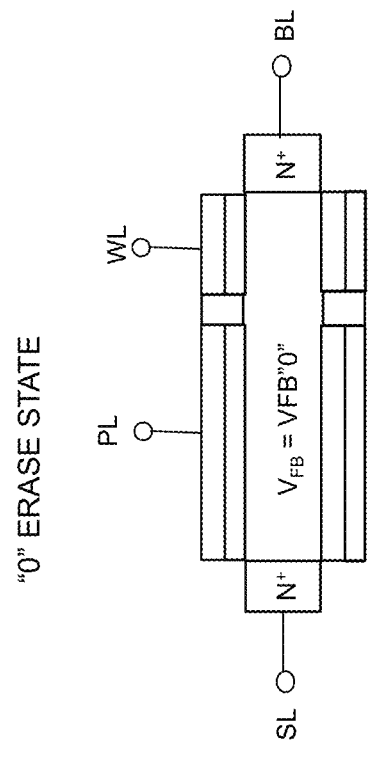
FIG.5B "0" ERASE STATE
Vb: BUILT-IN VOLTAGE ~0.7 V
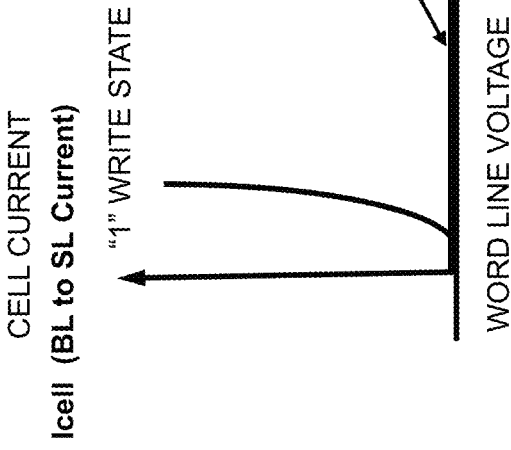
FIG.5C

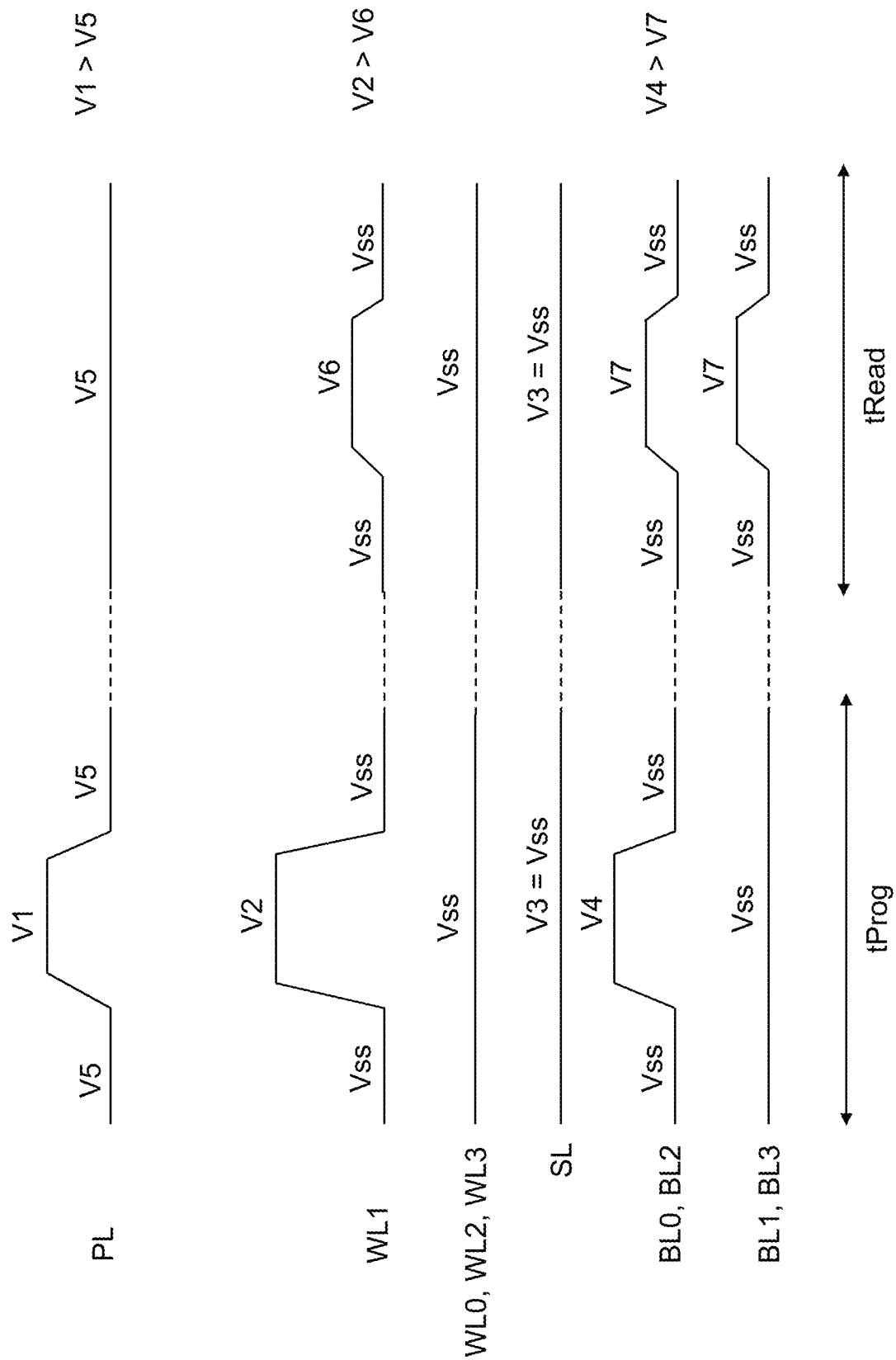

$$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

SEMICONDUCTOR ELEMENT MEMORY DEVICE

CROSS-REFERENCE TO RELATED APPLICATIONS

This application claims priority claims priority under 35 U.S.C. § 119(a) to PCT/JP2021/014598 filed on Apr. 6, 2021, the entire content of which is incorporated herein by reference.

TECHNICAL FIELD

The present invention relates to a semiconductor memory device using a semiconductor element.

BACKGROUND ART

In recent years, there has been a demand for a memory element having a higher degree of integration and a higher performance in the development of the LSI (Large Scale Integration) technology.

Typical planar MOS transistors have a channel that extends in a horizontal direction along the upper surface of a semiconductor substrate. In contrast, SGTs have a channel that extends in a direction perpendicular to the upper surface of a semiconductor substrate (refer to, for example, PTL 1 and NPL 1). For this reason, SGTs enable an increase in the density of semiconductor devices compared with planar MOS transistors. Such SGTs can be used as selection transistors to achieve s higher degree of integration of a DRAM (Dynamic Random Access Memory, refer to, for example, NPL 2) to which a capacitor is connected, a PCM (Phase Change Memory, refer to, for example, NPL 3) to which a resistance-change element is connected, an RRAM (Resistive Random Access Memory, refer to, for example, NPL 4), an MRAM (Magneto-resistive Random Access Memory, refer to, for example, NPL 5) in which the orientation of magnetic spins is changed with a current to change the resistance, and the like. Furthermore, there is a DRAM memory cell (refer to NPL 7) that is constituted by a single MOS transistor and that includes no capacitor. The present application relates to a dynamic flash memory that can be constituted only by a MOS transistor and that includes neither a resistance-change element nor a capacitor.

FIGS. 7A to 7D illustrate a write operation of the above-mentioned DRAM memory cell constituted by a single MOS transistor and including no capacitor, FIGS. 8A and 8B illustrate a problem in the operation thereof, and FIGS. 9A to 9C illustrate a read operation thereof (refer to NPLs 7 to 10). FIG. 7A illustrates a "1" write state. Here, the memory cell is formed in an SOI substrate 100 and constituted by a source N$^+$ layer 103 (hereinafter, a semiconductor region including a donor impurity at a high concentration will be referred to as "N$^+$ layer") to which a source line SL is connected, a drain N$^+$ layer 104 to which a bit line BL is connected, a gate conductor layer 105 to which a word line WL is connected, and a floating body (Floating Body) 102 of a MOS transistor 110. The memory cell of a DRAM is constituted by the single MOS transistor 110 and includes no capacitor. Note that a SiO$_2$ layer 101 of the SOI substrate is in contact with the floating body 102 directly under the floating body 102. When writing of "1" is performed in the memory cell constituted by the single MOS transistor 110, the MOS transistor 110 is operated in the saturation region. That is, a channel 107 for electrons extending from the source N$^+$ layer 103 has a pinch-off point 108 and does not reach the drain N$^+$ layer 104 to which the bit line BL is connected. When both the bit line BL connected to the drain N$^+$ layer 104 and the word line WL connected to the gate conductor layer 105 are set at high voltages, and the MOS transistor 110 is operated at a gate voltage that is about ½ of the drain voltage, the electric field strength becomes maximum at the pinch-off point 108 near the drain N$^+$ layer 104. As a result, accelerated electrons flowing from the source N$^+$ layer 103 toward the drain N$^+$ layer 104 collide with the lattice of Si, and electron-hole pairs are generated by the kinetic energy lost at this time (impact ionization phenomenon). Most of the generated electrons (not illustrated) reach the drain N$^+$ layer 104. Only a small number of very hot electrons jump over a gate oxide film 109 and reach the gate conductor layer 105. Holes 106 that have generated at the same time charge the floating body 102. In this case, the generated holes contribute to an increment of the majority carrier because the floating body 102 is P-type Si. When the floating body 102 is filled with the generated holes 106 and the voltage of the floating body 102 becomes higher than that of the source N$^+$ layer 103 by Vb or more, holes that are further generated are discharged to the source N$^+$ layer 103. Here, Vb is a built-in voltage of the PN junction between the source N$^+$ layer 103 and the floating body 102 of a P layer and is about 0.7 V. FIG. 7B illustrates a state in which the floating body 102 is charged to saturation with the generated holes 106.

Next, a "0" write operation of a memory cell 110 will be described with reference to FIG. 7C. The memory cell 110 in which "1" is written and the memory cell 110 in which "0" is written are present at random with respect to a common selected word line WL. FIG. 7C illustrates a state in which a "1" write state is rewritten to a "0" write state. At the time of writing "0", the voltage of the bit line BL is set to a negative bias, and the PN junction between the drain N$^+$ layer 104 and the floating body 102 of the P layer is forward biased. As a result, holes 106 that are generated in advance in the floating body 102 in the previous cycle flow into the drain N$^+$ layer 104 connected to the bit line BL. Upon completion of the write operation, a state of two memory cells, which are the memory cell 110 filled with the generated holes 106 (FIG. 7B) and the memory cell 110 in which the generated holes are discharged (FIG. 7C), is obtained. The potential of the floating body 102 of the memory cell 110 filled with the holes 106 becomes higher than that of the floating body 102 in which the generated holes are not present. Accordingly, the threshold voltage of the memory cell 110 in which "1" is written becomes lower than the threshold voltage of the memory cell 110 in which "0" is written. This state is illustrated in FIG. 7D.

Next, a problem in the operation of the memory cell constituted by the single MOS transistor 110 will be described with reference to FIGS. 8A and 8B. As illustrated in FIG. 8A, a capacitance $C_{FB}$ of the floating body 102 is the sum of a capacitance $C_{WL}$ between the gate to which the word line is connected and the floating body 102, a junction capacitance $C_{SL}$ of the PN junction between the source N$^+$ layer 103 to which the source line is connected and the floating body 102, and a junction capacitance $C_{BL}$ of the PN junction between the drain N$^+$ layer 104 to which the bit line is connected and the floating body 102 and is expressed as follows.

$$C_{FB}=C_{WL}+C_{BL}+C_{SL} \quad (10)$$

In addition, a capacitive coupling ratio Prim between the gate to which the word line is connected and the floating body 102 is expressed as follows.

$$\beta_{WL} = C_{WL}/(C_{WL}+C_{BL}+C_{SL}) \quad (11)$$

Accordingly, when a word line voltage $V_{WL}$ swings at the time of reading or at the time of writing, the voltage of the floating body 102 serving as a storage node (contact point) of the memory cell is also affected by this swing. This state is illustrated in FIG. 8B. When the word line voltage $V_{WL}$ increases from 0 V to $V_{WLH}$ at the time of reading or at the time of writing, a voltage $V_{FB}$ of the floating body 102 is increased from a voltage $V_{FB1}$ in the initial state before the change in the word line voltage to $V_{FB2}$ by a capacitive coupling with the word line. A voltage change amount $\Delta V_{FB}$ is expressed as follows.

$$\Delta V_{FB} = V_{FB2} - V_{FB1} \quad (12)$$
$$= \beta_{WL} \times V_{WLH}$$

Here, in $\beta_{WL}$ in Expression (11), $C_{WL}$ has a large contribution ratio, and, for example, $C_{WL}:C_{BL}:C_{SL}, =8:1:1$. In this case, $\beta_{WL}=0.8$. When the voltage of the word line changes, for example, from 5 V at the time of writing to 0 V after completion of writing, the floating body 102 is subjected to an amplitude noise of as large as 5 V×$\beta_{WL}$=4 V due to the capacitive coupling between the word line WL and the floating body 102. Accordingly, there has been a problem in that a potential difference margin is not provided sufficiently between the "1" potential and the "0" potential of the floating body 102 at the time of writing.

FIGS. 9A to 9C illustrate a read operation. FIG. 9A illustrates the "1" write state, and FIG. 9B illustrates the "0" write state. Actually, however, even if Vb is written in the floating body 102 in "1" writing, when the voltage of the word line returns to 0 V upon the completion of writing, the floating body 102 is lowered to a negative bias. Since writing of "0" brings a deeper negative bias, as illustrated in FIG. 9C, it is not possible to make the potential difference margin between "1" and "0" sufficiently large at the time of writing. This leads to a situation where it is difficult to actually commercialize a DRAM memory cell that includes no capacitor.

There is also a Twin-Transistor memory element in which one memory cell is formed in an SOI (Silicon on Insulator) layer by using two MOS transistors (refer to, for example, PTLs 4 and 5). In such an element, an N⁺ layer that divides floating body channels of the two MOS transistors and serves as a source or a drain is formed in contact with an insulating layer. Since this N⁺ layer is in contact with the insulating layer, the floating body channels of the two MOS transistors are electrically isolated from each other. A group of holes which are signal charges is stored in the floating body channel of one of the transistors. The voltage of the floating body channel in which holes are stored significantly changes as described above due to application of a pulse voltage to the gate electrode of the adjacent MOS transistor, as expressed by expression (12). As described with reference to FIGS. 7A-7D to 9A-9C, this prevents a sufficiently large operation margin between "1" and "0" at the time of writing (refer to, for example, PTL 14 and FIG. 8).

CITATION LIST

PTL

[PTL 1] Japanese Unexamined Patent Application Publication No. 2-188966 [PTL 2] Japanese Unexamined Patent Application Publication No. 3-171768 [PTL 3] Japanese Patent No. 3957774

[PTL 4] U.S. Patent Application Publication No. 2008/0137394
[PTL 5] U.S. Patent Application Publication No. 2003/0111681

[NPL]

[NPL 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)

[NPL 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)

[NPL 3] H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)

[NPL 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)

[NPL 5] W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)

[NPL 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)

[NPL 7] J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012)

[NPL 8] T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002)

[NPL 9] T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006)

[NPL 10] E. Yoshida: "A Capacitorless 1T-DRAM Technology Using Gate-Induced Drain-Leakage (GIDL) Current for Low-Power and High-Speed Embedded Memory", IEEE IEDM (2006)

[NPL 11] J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, May 2006.

[NPL 12] N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017.

[NPL 13] H. Jiang, N. Xu, B. Chen, L. Zengl, Y. He, G. Du, X. Liu and X. Zhang: "Experimental investigation of self-heating effect (SHE) in multiple-fin SOI FinFETs", Semicond. Sci. Technol. 29 (2014) 115021 (7pp).

[NPL 14] F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOT", IEICE Trans. Electron., Vol. E90-c., No. 4 pp. 765-771 (2007)

SUMMARY OF INVENTION

Technical Problem

In a capacitor-less single-transistor DRAM (gain cell), the capacitive coupling ratio between a word line and a floating body is large, and there has been a problem in that, when the potential of the word line is made to swing at the time of reading or writing of data, the swing is directly transmitted as noise to the floating body. This results in a problem of reading error or rewriting error of storage data and makes it difficult to put a capacitor-less single-transistor DRAM (gain cell) into practical use.

Solution to Problem

To solve the above problem, a semiconductor element memory device according to the present invention includes
a plurality of pages in columns, each of the pages being made of a plurality of memory cells arranged in rows, in which
each of the memory cells included in the page includes
a semiconductor base on a substrate, the semiconductor base standing vertically or extending horizontally to the substrate,
a first impurity layer and a second impurity layer at both ends of the semiconductor base,
a first gate insulating layer that surrounds part or all of a side surface of the semiconductor base between the first impurity layer and the second impurity layer and that is in contact with or close to the first impurity layer,
a second gate insulating layer that surrounds part or all of the side surface of the semiconductor base, that is connected to the first gate insulating layer, and that is in contact with or close to the second impurity layer,
a first gate conductor layer that covers part or all of the first gate insulating layer,
a second gate conductor layer that covers the second gate insulating layer, and
a channel semiconductor layer in which the semiconductor base is covered with the first gate insulating layer and the second gate insulating layer,
in each of the memory cells,
during a page write operation, a first voltage is applied to the first gate conductor layer, a second voltage is applied to the second gate conductor layer, a third voltage is applied to the first impurity layer, a fourth voltage is applied to the second impurity layer, a group of holes generated by an impact ionization phenomenon is retained in an inside of the channel semiconductor layer, and a voltage of the channel semiconductor layer is set to a first data retention voltage that is higher than either or both of voltages of the first impurity layer and the second impurity layer,
during a page erase operation, the voltages to be applied to the first gate conductor layer, the second gate conductor layer, the first impurity layer, and the second impurity layer are controlled to discharge the group of holes from the inside of the channel semiconductor layer in each of all the memory cells constituting the page, through either or both of the first impurity layer and the second impurity layer, and the voltage of the channel semiconductor layer is set to a second data retention voltage that is lower than the first data retention voltage, and during a page read operation, in each of all the memory cells constituting the page, a fifth voltage is applied to the first gate conductor layer, a sixth voltage is applied to the second gate conductor layer, the third voltage is applied to the first impurity layer, and a seventh voltage is applied to the second impurity layer, and
the fifth voltage is lower than the first voltage (first invention).

In the above first invention, the sixth voltage is lower than the second voltage (second invention).

In the above first invention, the seventh voltage is lower than the fourth voltage (third invention).

In the above first invention, the third voltage is a ground voltage (fourth invention).

In the above first invention, a first gate capacitance between the first gate conductor layer and the channel semiconductor layer is formed to be larger than a second gate capacitance between the second gate conductor layer and the channel semiconductor layer (fifth invention).

A semiconductor element memory device includes a block in which the plurality of pages of the memory device according to the above first to fifth inventions are arranged, in which
in each of the memory cells included in the plurality of pages, the first impurity layer is connected to a source line, the second impurity layer is connected to a bit line, one of the first gate conductor layer and the second gate conductor layer is connected to a word line, and the other is connected to a first drive control line,
the source line is connected across the semiconductor bases in the block, and
with voltages applied to the source line, the bit line, the first drive control line, and the word line, the page erase operation for discharging the group of holes in all the semiconductor bases of the page that is selected in the block is performed (sixth invention).

In the above sixth invention, the voltage applied to the first drive control line during the page read operation is lower than the voltage applied to the first drive control line during the page write operation, the voltage applied to the word line during the page read operation is lower than the voltage applied to the word line during the page write operation, and the voltage applied to the bit line during the page read operation is lower than the voltage applied to the bit line during the page write operation (seventh invention).

In the above sixth or seventh invention, the voltage applied to the source line is the ground voltage during the page write operation and the page read operation (eighth invention).

In the above first invention, the first gate conductor layer is isolated into two conductor layers that surround the first gate insulating layer in plan view (ninth invention).

BRIEF DESCRIPTION OF DRAWINGS

FIGS. 2A, 2B and 2C are diagrams for explaining effects obtained when a gate capacitance of a first gate conductor layer 5a connected to a plate line PL of the SGT-including memory device according to the first embodiment is made larger than a gate capacitance of a second gate conductor layer 5b to which a word line WL is connected.

FIGS. 4BA, 4BB, 4BC and 4BD are diagrams for explaining the page erase operation mechanism of the SGT-including memory device according to the first embodiment.

FIGS. 4DA, 4DB, 4DC and 4DD are diagrams for explaining the page erase operation mechanism of the SGT-including memory device according to the first embodiment.

FIGS. 4EA, 4EB, 4EC and 4ED are diagrams for explaining the page erase operation mechanism of the SGT-including memory device according to the first embodiment.

FIGS. 5A, 5B and 5C are diagrams for explaining a page read operation mechanism of the SGT-including memory device according to the first embodiment.

FIG. 6E is a diagram for explaining differences in applied voltages of the SGT-including memory device according to the first embodiment during the page write operation and the page read operation.

DESCRIPTION OF EMBODIMENTS

Embodiments of a memory device using an SGT as a semiconductor element (hereinafter, referred to as a dynamic flash memory) according to the present invention will be described below with reference to the drawings.

First Embodiment

The structure and operation mechanisms of a dynamic flash memory cell according to a first embodiment of the present invention will be described with reference to FIGS. 1 to 5A-5C. The structure of the dynamic flash memory cell will be described with reference to FIG. 1. Then, effects obtained when a gate capacitance of a first gate conductor layer 5a connected to a plate line PL is made larger than a gate capacitance of a second gate conductor layer 5b to which a word line WL is connected will be described with reference to FIGS. 2A-2C. Then, a data write operation mechanism will be described with reference to FIGS. 3AA-3AC to 3B, a data erase operation mechanism will be described with reference to FIGS. 4A to 4EA-4ED, and a data read operation mechanism will be described with reference to FIGS. 5A-5C.

Figure 1:
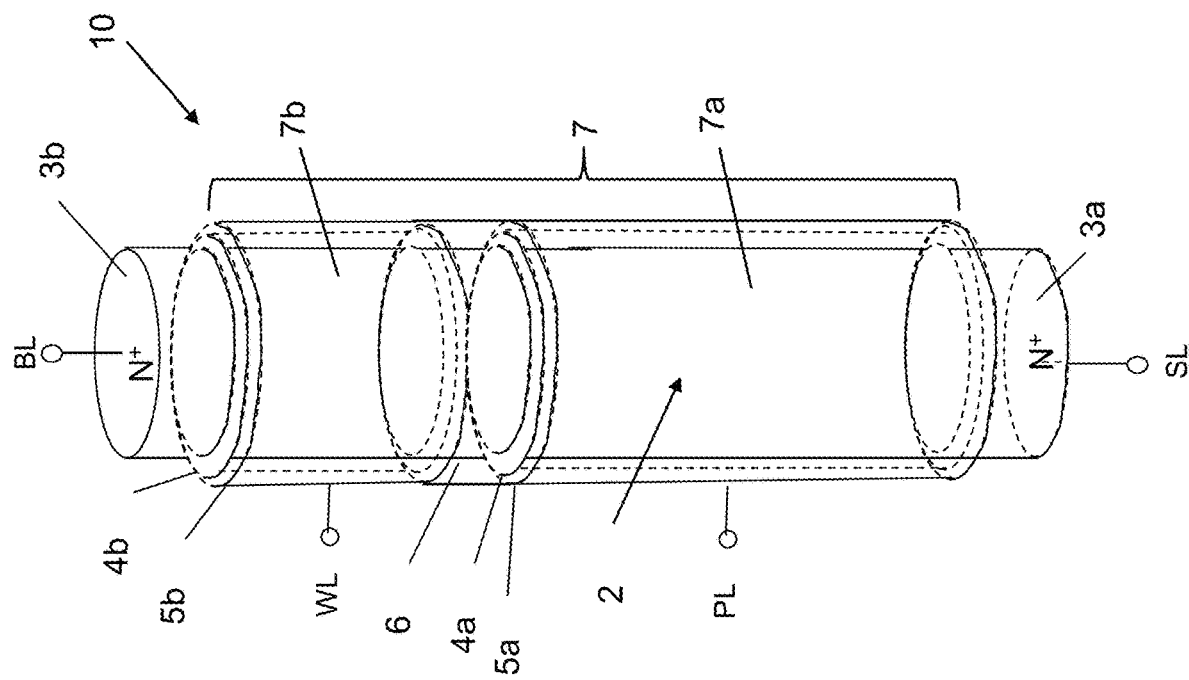
FIG. 1 is a structural view of an SGT-including memory device according to a first embodiment.

FIG. 1 illustrates the structure of a dynamic flash memory cell according to the first embodiment of the present invention. In upper and lower portions of a silicon semiconductor pillar 2 of a P-type or an i-type (intrinsic) conductivity type (hereinafter, a silicon semiconductor pillar is referred to as "Si pillar") (an example of "semiconductor base" in the claims) formed on a substrate (an example of "substrate" in the claims), $N^+$ layers 3a and 3b one of which serves as a source and the other one of which serves as a drain (examples of "first impurity layer" and "second impurity layer" in the claims) are formed. A portion of the Si pillar 2 between the $N^+$ layers 3a and 3b, which serves as a source and a drain, serves as a channel region 7 (an example of "channel semiconductor layer" in the claims). A first gate insulating layer 4a (an example of "first gate insulating layer" in the claims) and a second gate insulating layer 4b (an example of "second gate insulating layer" in the claims) are formed so as to surround the channel region 7. The first gate insulating layer 4a and the second gate insulating layer 4b are respectively in contact with or close to the $N^+$ layers 3a and 3b serving as the source and the drain. The first gate conductor layer 5a (an example of "first gate conductor layer" in the claims) and a second gate conductor layer 5b (an example of "second gate conductor layer" in the claims) are respectively formed so as to surround the first gate insulating layer 4a and the second gate insulating layer 4b. The first gate conductor layer 5a and the second gate conductor layer 5b are isolated from each other by an insulating layer 6. The channel region 7 between the $N^+$ layers 3a and 3b is made of a first channel Si layer 7a surrounded by the first gate insulating layer 4a and a second channel Si layer 7b surrounded by the second gate insulating layer 4b. Thus, a dynamic flash memory cell 10 made of the $N^+$ layers 3a and 3b serving as the source and the drain, the channel region 7, the first gate insulating layer 4a, the second gate insulating layer 4b, the first gate conductor layer 5a, and the second gate conductor layer 5b is formed. The $N^+$ layer 3a serving as the source, the $N^+$ layer 3b serving as the drain, the first gate conductor layer 5a, and the second gate conductor layer 5b are respectively connected to a source line SL (an example of "source line" in the claims), a bit line BL (an example of "bit line" in the claims), the plate line PL (an example of "first drive control line" in the claims), and the word line WL (an example of "word line" in the claims), respectively. The structure is preferably provided such that the gate capacitance of the first gate conductor layer 5a to which the plate line PL is connected is larger than the gate capacitance of the second gate conductor layer 5b to which the word line WL is connected.

In FIG. 1, the gate length of the first gate conductor layer 5a is made longer than the gate length of the second gate conductor layer 5b such that the gate capacitance of the first gate conductor layer 5a connected to the plate line PL is larger than the gate capacitance of the second gate conductor layer 5b to which the word line WL is connected. Alternatively, the thickness of the gate insulating film of the first gate insulating layer 4a may be made smaller than the thickness of the gate insulating film of the second gate insulating layer 4b by making the film thicknesses of the respective gate insulating layers different without making the gate length of the first gate conductor layer 5a longer than the gate length of the second gate conductor layer 5b. Further alternatively, the dielectric constant of the gate insulating film of the first gate insulating layer 4a may be made higher than the dielectric constant of the gate insulating film of the second gate insulating layer 4b by making the dielectric constants of the materials of the respective gate insulating layers different. Further alternatively, any of the lengths of the gate conductor layers 5a and 5b and the film thicknesses and the dielectric constants of the gate insulating layers 4a and 4b may be combined such that the gate capacitance of the first gate conductor layer 5a connected to the plate line PL is larger than the gate capacitance of the second gate conductor layer 5b to which the word line WL is connected.

FIGS. 2A to 2C are diagrams for describing effects obtained when the gate capacitance of the first gate conductor layer 5a connected to the plate line PL is made larger than the gate capacitance of the second gate conductor layer 5b to which the word line WL is connected.

FIG. 2A briefly illustrates only a primary portion of the structural view of the dynamic flash memory cell according to the first embodiment of the present invention. The bit line BL, the word line WL, the plate line PL, and the source line SL are connected to the dynamic flash memory cell, and voltage states thereof determine a potential state of the channel region 7.

FIG. 2B is a diagram for explaining a relationship of the respective capacitances. A capacitance $C_{FB}$ of the channel region 7 is the sum of a capacitance $C_{WL}$ between the gate conductor layer 5b to which the word line WL is connected and the channel region 7, a capacitance $C_{PL}$ between the gate conductor layer 5a to which the plate line PL is connected and the channel region 7, a junction capacitance $C_{SL}$ of the PN junction between the source N$^+$ layer 3a to which the source line is connected and the channel region 7, and a junction capacitance $C_{BL}$ of the PN junction between the drain N$^+$ layer 3b to which the bit line is connected and the channel region 7 and is expressed as follows.

$$C_{FB}=C_{WL}+C_{PL}+C_{BL}+C_{SL} \quad (1)$$

Accordingly, a coupling ratio $\beta_{WL}$ between the word line WL and the channel region 7, a coupling ratio $\beta_{PL}$ between the plate line PL and the channel region 7, a coupling ratio $\beta_{BL}$ between the bit line BL and the channel region 7, and a coupling ratio v between the source line SL and the channel region 7 are each expressed as follows.

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Here, since $C_{PL}>C_{WL}$, $\beta_{PL}>\beta_{WL}$ is satisfied.

FIG. 2C is a diagram for explaining a change in a voltage $V_{FB}$ of the channel region 7 when a voltage $V_{WL}$ of the word line WL increases and then decreases during a read operation and a write operation. Here, when the voltage $V_{WL}$ of the word line WL increases from 0 V to a high-voltage state $V_{WLH}$, the voltage $V_{FB}$ of the channel region 7 becomes a high-voltage state $V_{FBH}$ from a low-voltage state $V_{FBL}$. A potential difference $\Delta V_{FB}$ in this case is as follows.

$$\Delta V_{FB} = V_{FBH} - V_{FBL} \quad (6)$$

$$= \beta_{WL} \times V_{WLH}$$

Since the coupling ratio $\beta_{WL}$ between the word line WL and the channel region 7 is small and the coupling ratio $\beta_{PL}$ between the plate line PL and the channel region 7 is large, $\Delta V_{FB}$ is small, and the voltage $\Delta V_{FB}$ of the channel region 7 does not almost change even if the voltage $V_{WL}$ of the word line WL swings during the read operation and the write operation.

Figure 3A:
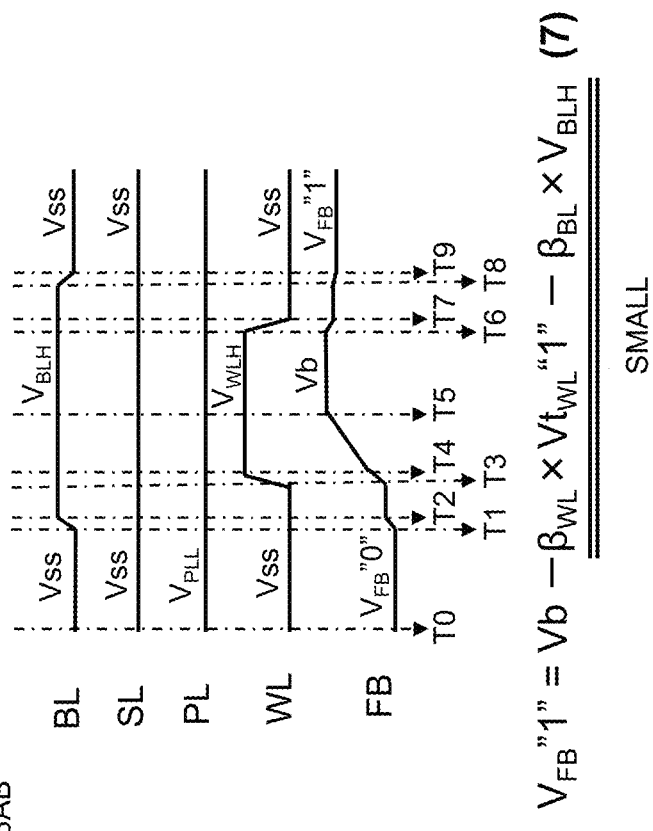
FIGS. 3AA, 3AB and 3AC are diagrams for explaining a page write operation mechanism of the SGT-including memory device according to the first embodiment.
Figure 3A:
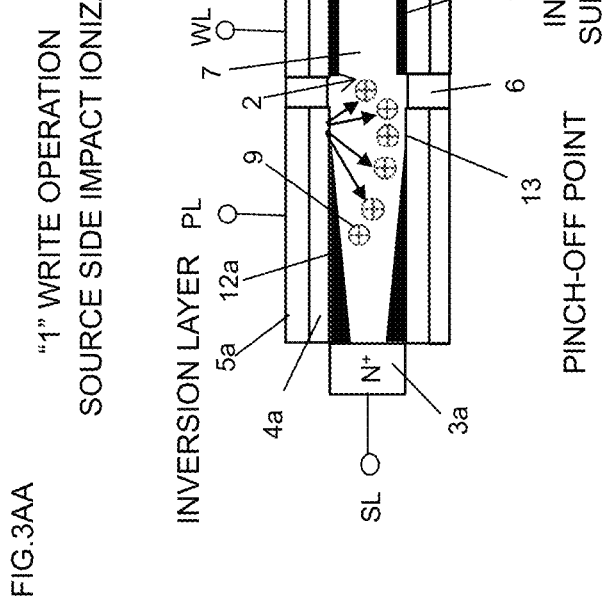
Figure 3A:
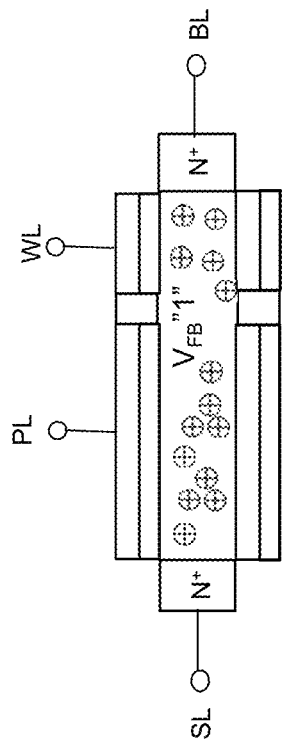
Figure 3B:
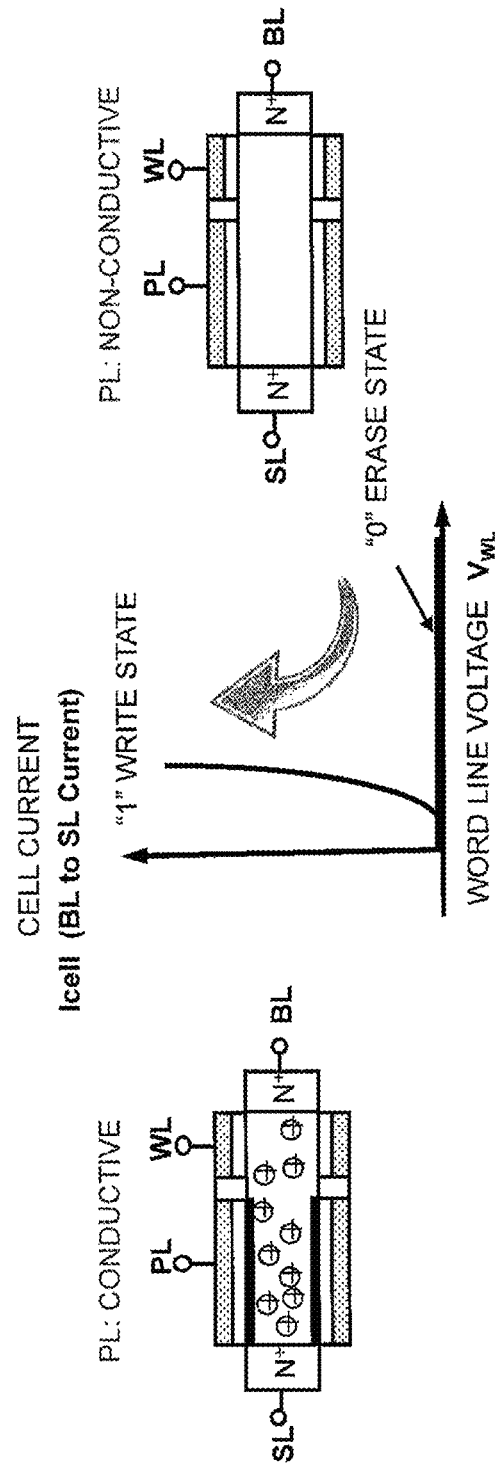
FIG. 3B is a diagram for explaining the page write operation mechanism of the SGT-including memory device according to the first embodiment.

FIGS. 3AA to 3AC and FIG. 3B illustrate a page write operation (an example of "page write operation" in the claims) of the dynamic flash memory cell according to the first embodiment of the present invention. FIG. 3AA illustrates a write operation mechanism, and FIG. 3AB illustrates operation waveforms of the bit line BL, the source line SL, the plate line PL, the word line WL, and the channel region 7 serving as a floating body FB. At time T0, the dynamic flash memory cell is in a "0" erase state, and the voltage of the channel region 7 is $V_{FB}$ "0". In addition, Vss is applied to the bit line BL, the source line SL, and the word line WL, and $V_{PLL}$ is applied to the plate line PL. Here, Vss is 0 V, and $V_{PLL}$ is 2 V, for example. Subsequently, at time T1 and T2, in response to an increase of the voltage of the bit line BL from Vss to $V_{BLH}$, if Vss is 0 V, for example, the voltage of the channel region 7 becomes $V_{FB}$ "0"+$\beta_{BL} \times V_{BLH}$ due to a capacitive coupling between the bit line BL and the channel region 7.

The explanation of the write operation of the dynamic flash memory cell will be continued with reference to FIGS. 3AA) and 3AB. At times T3 and T4, the voltage of the word line WL increases from Vss to $V_{WLH}$ Accordingly, if a threshold voltage for erasing "0" in a second N-channel MOS transistor region in which the second gate conductor layer 5b to which the word line WL is connected surrounds the channel region 7 is $Vt_{WL}$ "0", as the voltage of the word line WL increases, from Vss to $Vt_{WL}$ "0", the voltage of the channel region 7 becomes $V_{FB}$ "0"+$\beta_{WL} \times V_{BLH}$+$\beta$WL$\times Vt_{WL}$ "0" due to a second capacitive coupling between the word line WL and the channel region 7. If the voltage of the word line WL increases to be greater than or equal to $Vt_{WL}$ "0", a ring-shaped inversion layer 12b is formed in the channel region 7 on the inner periphery of the second gate conductor layer 5b, and the second capacitive coupling between the word line WL and the channel region 7 is blocked.

The explanation of the write operation of the dynamic flash memory cell will be continued with reference to FIGS. 3AA and 3AB. At times T3 and T4, for example, $V_{PLL}$=2 V is fixedly input to the first gate conductor layer 5a to which the plate line PL is connected, and the voltage of the second gate conductor layer 5b to which the word line WL is connected is increased to, for example, $V_{WLH}$=4 V. As a result, as illustrated in FIG. 3AA, a ring-shaped inversion layer 12a is formed in the channel region 7 on the inner periphery of the first gate conductor layer 5a to which the plate line PL is connected, and a pinch-off point 13 is present in the inversion layer 12a. As a result, a first N-channel MOS transistor region including the first gate conductor layer 5a is operated in the saturation region. On the other hand, the second N-channel MOS transistor region including the second gate conductor layer 5b to which the word line WL is connected is operated in the linear region. As a result, no pinch-off point is present in the channel region 7 on the inner periphery of the second gate conductor layer 5b to which the word line WL is connected, and the inversion layer 12*b* is formed over the entire surface of the inner periphery of the gate conductor layer 5*b*. This inversion layer 12*b* formed over the entire surface of the inner periphery of the second gate conductor layer 5*b* to which the word line WL is connected substantially functions as a drain of the first N-channel MOS transistor region. As a result, the electric field becomes maximum in a first boundary region of the channel region 7 between the first N-channel MOS transistor region including the first gate conductor layer 5*a* and the second N-channel MOS transistor region including the second gate conductor layer 5*b* that are connected in series, and an impact ionization phenomenon occurs in this region. This region is a region on the source side when viewed from the second N-channel MOS transistor region including the second gate conductor layer 5*b* to which the word line WL is connected, and thus, this phenomenon is referred to as a source-side impact ionization phenomenon. As a result of this source-side impact ionization phenomenon, electrons flow from the N$^+$ layer 3*a* to which the source line SL is connected toward the N$^+$ layer 3*b* to which the bit line BL is connected. The accelerated electrons collide with lattice Si atoms, and electron-hole pairs are generated by the kinetic energy. Although some of the generated electrons flow into the first gate conductor layer 5*a* and the second gate conductor layer 5*b*, most of the generated electrons flow into the N$^+$ layer 3*b* to which the bit line BL is connected (not illustrated).

As illustrated in FIG. 3AC, the generated group of holes 9 (an example of "group of holes" in the claims) serves as majority carriers in the channel region 7 and charges the channel region 7 to a positive bias. Since the N$^+$ layer 3*a* to which the source line SL is connected is at 0 V, the channel region 7 is charged up to a built-in voltage Vb (about 0.7 V) of the PN junction between the N$^+$ layer 3*a* to which the source line SL is connected and the channel region 7. When the channel region 7 is charged to a positive bias, the threshold voltages of the first N-channel MOS transistor region and the second N-channel MOS transistor region decrease due to a substrate bias effect.

The explanation of the write operation of the dynamic flash memory cell will be continued with reference to FIG. 3AB. At times T6 and T7, the voltage of the word line WL decreases from $V_{WLH}$ to Vss. Although the second capacitive coupling occurs between the word line WL and the channel region 7 at this time, the inversion layer 12*b* blocks the second capacitive coupling until the voltage $V_{WLH}$ of the word line WL becomes less than or equal to a threshold voltage $Vt_{WL}$ "1" of the second N-channel MOS transistor region when the voltage of the channel region 7 is Vb. Accordingly, the substantial capacitive coupling between the word line WL and the channel region 7 occurs only when the voltage of the word line WL becomes less than or equal to $Vt_{WL}$ "1" and decreases to Vss. As a result, the voltage of the channel region 7 becomes Vb−$\beta_{WL}$×$Vt_{WL}$ "1". Here, $Vt_{WL}$ "1" is lower than $Vt_{WL}$ "0" above, and $\beta_{WL}$×$Vt_{WL}$ "1" is small.

The explanation of the write operation of the dynamic flash memory cell will be continued with reference to FIG. 3AB. At times T8 and T9, the voltage of the bit line BL decreases from $V_{BLH}$ to Vss. Due to a capacitive coupling between the bit line BL and the channel region 7, eventually, a "1" write voltage $V_{FB}$ "1" of the channel region 7 becomes as follows.

$$V_{FB}\text{"1"}=Vb-\beta_{WL}\times Vt_{WL}\text{"1"}-\beta_{BL}\times V_{BLH} \qquad (7)$$

Here, the coupling ratio $\beta_{BL}$ between the bit line BL and the channel region 7 is also small. Accordingly, as illustrated in FIG. 3B, the threshold voltage of the second N-channel MOS transistor region of the second channel Si layer 7*b* to which the word line WL is connected is decreased. By performing a memory write operation (an example of "page write operation" in the claims) in which the "1" write state of the channel region 7 is set as a first data retention voltage (an example of "first data retention voltage" in the claims), and this state is assigned to logical storage data "1".

At the time of the write operation, instead of the first boundary region, in a second boundary region between the first impurity layer 3*a* and the first channel Si layer 7*a* or a third boundary region between the second impurity layer 3*b* and the second channel Si layer 7*b*, electron-hole pairs may be generated by the impact ionization phenomenon, and the generated group of holes 9 may charge the channel region 7.

A page erase operation (an example of "page erase operation" in the claims) mechanism will be described with reference to FIG. 4A to FIGS. 4EA-4ED.

Figure 4A:
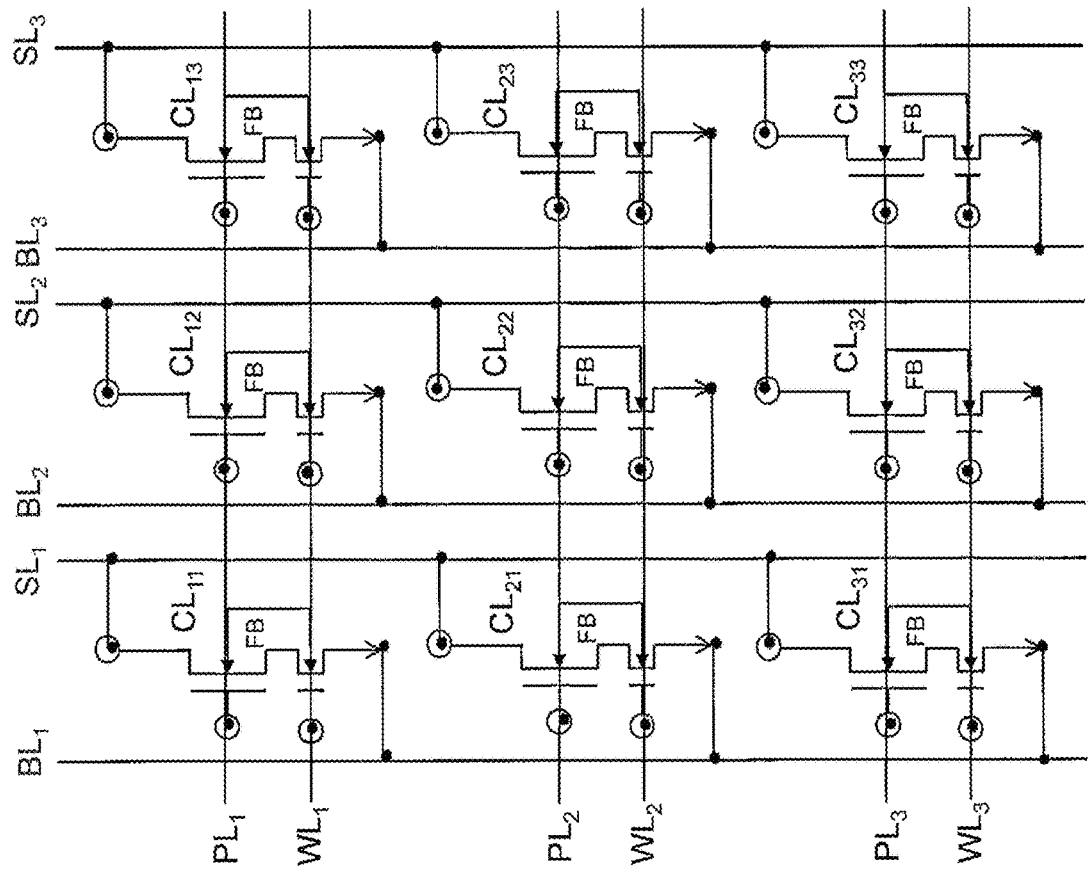
FIG. 4A is a diagram for explaining a page erase operation mechanism of the SGT-including memory device according to the first embodiment.

FIG. 4A illustrates a memory block circuit diagram for explaining the page erase operation. Here, although nine memory cells CL$_{11}$ to CL$_{33}$ of three rows and three columns are illustrated, an actual memory block is larger than this matrix. When memory cells are arranged in a matrix, one direction of the arrangement is referred to as "row direction" (or "in rows"), and a direction perpendicular to this is referred to as "column direction" (or "in columns"). To the respective memory cells, source lines SL$_1$ to SL$_3$, bit lines BL$_1$ to BL$_3$, plate lines PL$_1$ to PL$_3$, and word lines WL$_1$ to WL$_3$ are connected. For example, it is assumed that the memory cells CL$_{21}$ to CL$_{23}$ to which the plate line PL$_2$ and the word line WL$_2$ are connected are selected in this block, and the page erase operation is performed.

The page erase operation mechanism will be described with reference to FIGS. 4BA to 4BD and FIG. 4C. Here, the channel region 7 between the N$^+$ layers 3*a* and 3*b* is electrically isolated from the substrate and serves as a floating body. FIG. 4BA illustrates a timing operation waveform diagram of primary nodes in the erase operation. In FIG. 4BA, T0 to T12 denote times from start to end of the erase operation. FIG. 4BB illustrates a state in which, at time T0 before the erase operation, the group of holes 9 generated by impact ionization in a previous cycle is stored in the channel region 7. Then, at times T1 and T2, the voltages of the bit lines BL$_1$ to BL$_3$ become $V_{BLH}$, which is a high-voltage state, from Vss, and the voltages of the source lines SL$_1$ to SL$_3$ becomes $V_{SLH}$, which is a high-voltage state, from Vss. Here, Vss is, for example, 0 V. In this operation, at the following times T3 and T4, the voltages of the plate line PL$_2$ and the word line WL$_2$ selected in the page erase operation become a second voltage $V_{PLH}$ and a fourth voltage $V_{WLH}$, which are high-voltage states, from the first voltage $V_{PLL}$ and from the third voltage Vss, respectively, and the inversion layer 12*a* on the inner periphery of the first gate conductor layer 5*a* to which the plate line PL$_2$ is connected and the inversion layer 12*b* on the inner periphery of the second gate conductor layer 5*b* to which the word line WL$_2$ is connected are not formed in the channel region 7. Accordingly, the voltages of $V_{BLH}$ and $V_{SLH}$ are desirably $V_{BLH}$>$V_{WLH}$+$V_{tWL}$ and $V_{SLH}$>$V_{PLH}$+$V_{tPL}$ where $V_{tWL}$ and $V_{tPL}$ are threshold voltages of the second N-channel MOS transistor region on the word line WL$_2$ side and the first N-channel MOS transistor region on the plate line PL$_2$ side, respectively. For example, when $V_{tWL}$ and $V_{tPL}$ are 0.5 V, $V_{WLH}$ and $V_{PLH}$ may be set to 3 V, and $V_{BLH}$ and $V_{SLH}$ may be set to be greater than or equal to 3.5 V.

The explanation of the page erase operation mechanism in FIG. 4BA will be continued. At times T3 and T4, as the voltages of the plate line $PL_2$ and the word line $WL_2$ become the second voltage $V_{PLH}$ and the fourth voltage $V_{WLH}$, which are high-voltage states, the voltage of the channel region 7 in the floating state is boosted by a first capacitive coupling between the plate line $PL_2$ and the channel region 7 and the second capacitive coupling between the word line $WL_2$ and the channel region 7. The voltage of the channel region 7 becomes a high voltage from $V_{FB}$ "1" in the "1" write state. This can be boosted because the voltages of the bit lines $BL_1$ to $BL_3$ and the source lines $SL_1$ to $SL_3$ are $V_{BLH}$ and $V_{SLH}$, which are high voltages, and the PN junction between the source N$^+$ layer 3$a$ and the channel region 7 and the PN junction between the drain N$^+$ layer 3$b$ and the channel region 7 are in a reverse-biased state.

The explanation of the page erase operation mechanism in FIG. 4BA will be continued. At the following times T5 and T6, the voltages of the bit lines $BL_1$ to $BL_3$ and the source lines $SL_1$ to $SL_3$ decrease from $V_{BLH}$ and $V_{SLH}$, which are high voltages, to Vss. As a result, the PN junction between the source N$^+$ layer 3$a$ and the channel region 7 and the PN junction between the drain N$^+$ layer 3$b$ and the channel region 7 become a forward-biased state as illustrated in FIG. 4BC, and a remaining group of holes in the group of holes 9 in the channel region 7 is discharged to the source N$^+$ layer 3$a$ and the drain N$^+$ layer 3$b$. As a result, the voltage $V_{FB}$ of the channel region 7 becomes the built-in voltage Vb of the PN junction formed by the source N$^+$ layer 3$a$ and the channel region 7 of a P layer and the PN junction formed by the drain N$^+$ layer 3$b$ and the channel region 7 of the P layer.

The explanation of the page erase operation mechanism in FIG. 4BA will be continued. Subsequently, at times T7 and T8, the voltages of the bit lines $BL_1$ to $BL_3$ and the source lines $SL_1$ to $SL_3$ increase from Vss to $V_{BLH}$ and $V_{SLH}$, which are high voltages. By this measure, as illustrated in FIG. 4BD, at times T9 and T10, when the voltages of the plate line $PL_2$ and the word line $WL_2$ decrease from the second voltage $V_{PLH}$ and the fourth voltage $V_{WLH}$ to the first voltage $V_{PLL}$ and the third voltage Vss, without forming the inversion layer 12$a$ on the plate line $PL_2$ side and the inversion layer 12$b$ on the word line $WL_2$ side in the channel region 7, the voltage $V_{FB}$ of the channel region 7 efficiently becomes from Vb to $V_{FB}$ "0" by the first capacitive coupling between the plate line $PL_2$ and the channel region 7 and the second capacitive coupling between the word line $WL_2$ and the channel region 7. Accordingly, the voltage difference $\Delta V_{FB}$ of the channel region 7 between the "1" write state and the "0" erase state is expressed by the following expressions.

$$V_{FB}"1" = Vb - \beta_{WL} \times Vt_{WL}"1" - \beta_{BL} \times V_{BLH} \quad (7)$$

$$V_{FB}"0" = Vb - \beta_{WL} \times V_{WLH} - \beta_{PL} \times (V_{PLH} - V_{PLL}) \quad (8)$$

$$\Delta V_{FB} = V_{FB}"1" - V_{FB}"0" \quad (9)$$

$$= \beta_{WL} \times V_{WLH} + \beta_{PL} \times (V_{PLH} - V_{PLL}) -$$

$$\beta_{WL} \times Vt_{WL}"1" - \beta_{BL} \times V_{BLH}$$

Here, the sum of $\beta_{WL}$ and $\beta_{PL}$ is greater than or equal to 0.8, $\Delta V_{FB}$ is large, and a sufficient margin is obtained.

Figure 4C:
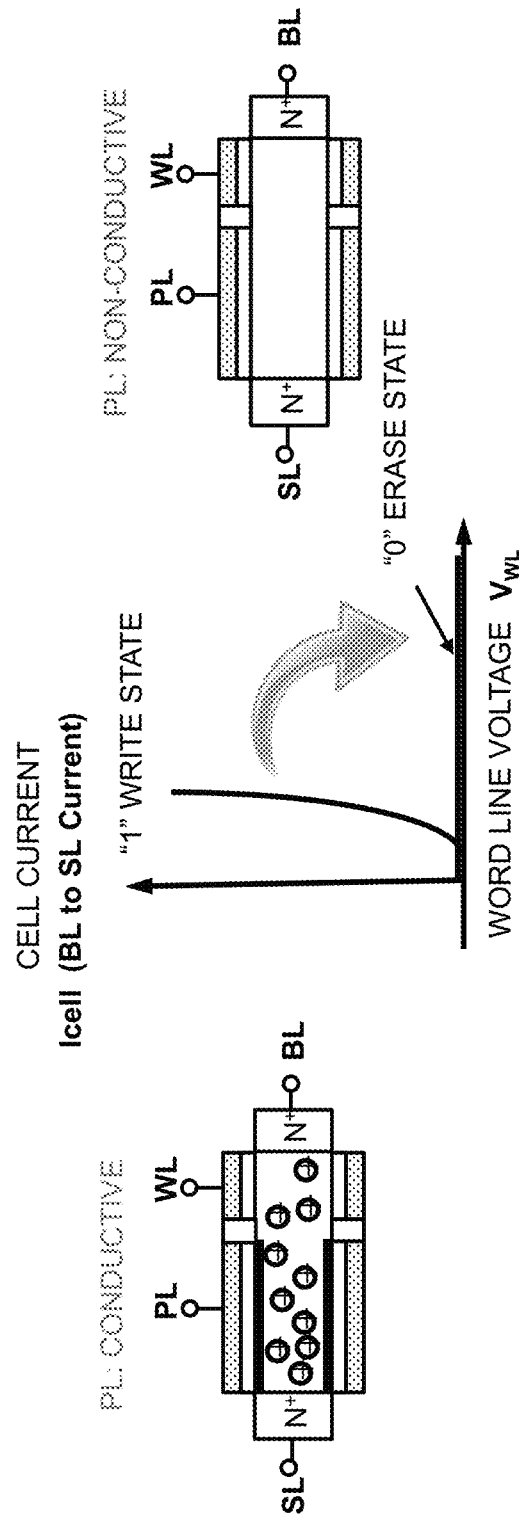
FIG. 4C is a diagram for explaining the page erase operation mechanism of the SGT-including memory device according to the first embodiment.

As a result, as illustrated in FIG. 4C, the large margin is obtained between the "1" write state and the "0" erase state. Here, in the "0" erase state, the threshold voltage on the plate line $PL_2$ side increases due to a substrate bias effect. Accordingly, for example, if the voltage applied to the plate line $PL_2$ is made less than or equal to the threshold voltage thereof, the first N-channel MOS transistor region on the plate line $PL_2$ side becomes non-conductive, and a memory cell current does not flow. "PL: non-conductive" on the right in FIG. 4C illustrates this state.

The explanation of the page erase operation mechanism in FIG. 4BA will be continued. Subsequently, at times T11 and T12, the voltages of the bit lines $BL_1$ to $BL_3$ decrease from $V_{BLH}$ to Vss, the voltages of the source lines $SL_1$ to $SL_3$ decrease from $V_{SLH}$ to Vss, and the erase operation ends. At this time, the voltages of the bit lines $BL_1$ to $BL_3$ and the source lines $SL_1$ to $SL_3$ slightly decrease the voltage of the channel region 7 due to the capacitive coupling. However, since the decrease is equal to the increase in the voltage of the channel region 7 by the bit lines $BL_1$ to $BL_3$ and the source lines $SL_1$ to $SL_3$ due to the capacitive coupling at times T7 and T8, the increase and decrease in the voltages of the bit lines $BL_1$ to $BL_3$ and the source lines $SL_1$ to $SL_3$ cancel each other. As a result, there is no influence on the voltage of the channel region 7. By performing the page erase operation in which the voltage $V_{FB}$ "0" in the "0" erase state of the channel region 7 is set as a second data retention voltage (an example of "second data retention voltage" in the claims), and this state is assigned to logical storage data "0".

Next, the page erase operation mechanism will be explained with reference to FIGS. 4DA to 4DD. Differences between FIGS. 4DA-4DD and FIGS. 4BA-4BD are that, during the page erase operation, the bit lines $BL_1$ to $BL_3$ are at Vss or in a floating state and the word line $WL_2$ is fixed at Vss. Accordingly, even if the voltages of the source lines $SL_1$ to $SL_3$ increase from Vss to $V_{SLH}$ at times T1 and T2, the second N-channel MOS transistor region of the word line $WL_2$ is non-conductive, and the memory cell current does not flow. Therefore, there is no generation of the group of holes 9 by the impact ionization phenomenon. Besides, as in FIGS. 4BA-4BD, the voltages of the source lines $SL_1$ to $SL_3$ swing between Vss and $V_{SLH}$, and the voltage of the plate line $PL_2$ swings between $V_{PLL}$ and $V_{PLH}$. As a result, as illustrated in FIG. 4DC, the group of holes 9 is discharged to the first impurity layer N$^+$ layer 3$a$ of the source lines $SL_1$ to $SL_3$.

Next, the page erase operation mechanism will be described with reference to FIGS. 4EA to 4ED. Differences between FIGS. 4EA-4ED and FIGS. 4BA-4BD are that, during the page erase operation, the source lines $SL_1$ to $SL_3$ are at Vss or in a floating state and the plate line $PL_2$ is fixed at Vss. Accordingly, even if the voltages of the bit lines $BL_1$ to $BL_3$ increase from Vss to $V_{BLH}$ at times T1 and T2, the first N-channel MOS transistor region of the plate line $PL_2$ is non-conductive, and the memory cell current does not flow. Therefore, there is no generation of the group of holes 9 by the impact ionization phenomenon. Besides, as in FIGS. 4BA-4BD, the voltages of the bit lines $BL_1$ to $BL_3$ swing between Vss and $V_{BLH}$, and the voltage of the word line $WL_2$ swings between Vss and $V_{WLH}$ As a result, as illustrated in FIG. 4EC, the group of holes 9 is discharged to the second impurity layer N$^+$ layer 3$b$ of the bit lines $BL_1$ to $BL_3$.

FIGS. 5A to 5C are diagrams for explaining a read operation of the dynamic flash memory cell according to the first embodiment of the present invention. As illustrated in FIG. 5A, when the channel region 7 is charged up to the built-in voltage Vb (about 0.7 V), the threshold voltage of the second N-channel MOS transistor region having the second gate conductor layer 5$b$ to which the word line WL is connected decreases due to a substrate bias effect. This state is assigned to logical storage data "1". As illustrated in FIG. 5B, a memory block selected before writing is in an erase state "0" in advance, the voltage $V_{FB}$ of the channel region 7 is $V_{FB}$ "0". A write state "1" is stored at random by the write operation. As a result, logical storage data of logical "0" and "1" is created for the word line WL. As illustrated in FIG. 5C, the level difference between the two threshold voltages for the word line WL is utilized to perform reading by a sense amplifier. In data reading, the voltage applied to the first gate conductor layer 5a connected to the plate line PL is set to be higher than the threshold voltage at the time of logical storage data "1" and lower than the threshold voltage at the time of logical storage data "0" to thereby obtain the characteristic that a current does not flow even when the voltage of the word line WL is increased, as illustrated in FIG. 5C.

Next, differences in applied voltages during the page write operation and the page read operation will be described with reference to FIGS. 6A to 6E.

Figure 6A:
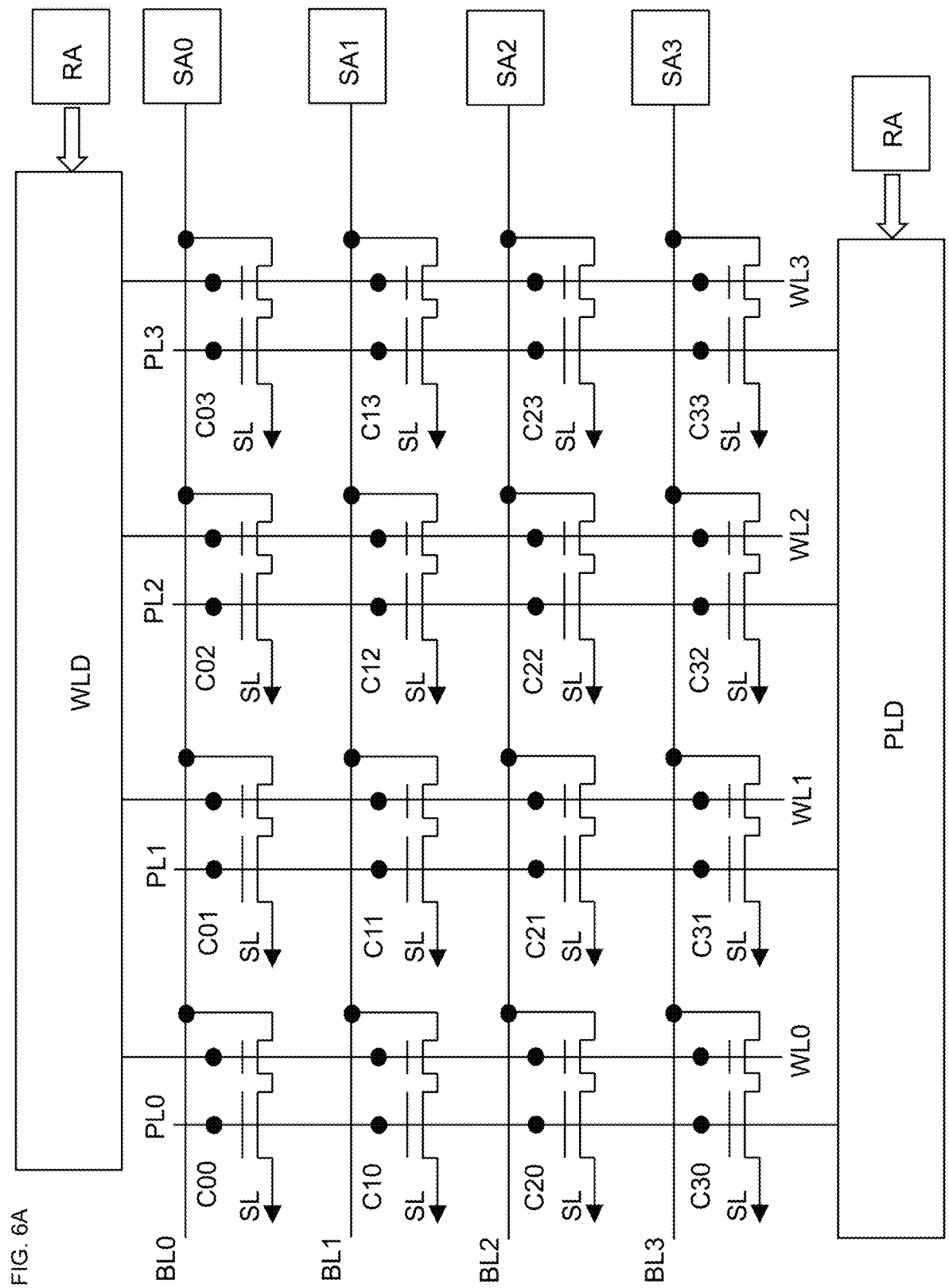
FIG. 6A is a diagram for explaining differences in applied voltages of the SGT-including memory device according to the first embodiment during the page write operation and the page read operation.

FIG. 6A illustrates part of a block in which memory cells C00 to C33 are arranged in four rows×four columns. In an actual block, the number of memory cells here is larger than four rows×four columns. To the respective memory cells, word lines WL0 to WL3, plate lines PL0 to PL3, and bit lines BL0 to $BL_3$ are connected. In addition, the bit lines BL0 to BL3 are connected to sense amplifier circuits SA0 to SA3. Furthermore, the word lines WL0 to $WL_3$ are connected to a word line decoder circuit WLD, and the plate lines PL0 to PL3 are connected to a plate line decoder circuit PLD. Furthermore, a row address RA is input to the word line decoder circuit WLD and the plate line decoder circuit PLD, and the word lines WL0 to WL3 and the plate lines PL0 to PL3 are selected respectively.

Next, differences in applied voltages during the page write operation and the page read operation will be described with reference to the circuit block diagram in FIG. 6A and the operation waveform diagram in FIG. 6B. First, a page write operation period tProg will be described. For example, a case is assumed in which a given row address RA is input to the word line decoder circuit WLD and the plate line decoder circuit PLD. In a case where the row address RA to be input selects WL1 and PL1, a page write operation is performed on the memory cells C01, C11, C21, and C31. Here, since the page erase operation is always performed before the page write operation, all storage data in the memory cells C01, C11, C21, and C31 is in the "0" erase state. In addition, the page erase operation mechanism and the operation waveforms correspond to FIGS. 4BA-4BD, FIGS. 4DA-4DD, or FIGS. 4EA-4ED.

A first voltage V1 (an example of "first voltage" in the claims), which is a voltage higher than a fifth voltage V5 (an example of "fifth voltage" in the claims), is applied to the selected plate line PL1. Here, the fifth voltage V5 is constantly applied to the plate line PL1 except during the page erase operation or the page write operation. The fifth voltage V5 is applied to the non-selected plate lines PL0, PL2, and PL3. In addition, a second voltage V2 (an example of "second voltage" in the claims) is applied to the selected word line WL1. Here, for example, Vss is constantly applied to the word line WL1 except during the page erase operation, the page write operation, or the page read operation. Thus, Vss is applied to the non-selected word lines WL0, WL2, and $WL_3$. Vss here is, for example, 0 V. In addition, a third voltage V3 (an example of "third voltage" in the claims) is applied to the source line SL. The third voltage V3 here is a ground voltage Vss (an example of "ground voltage" in the claims) and is, for example, 0 V.

Page data for the page write operation is input (Load) in advance to the sense amplifier circuits SA0 to SA3. A case is assumed in which, on the basis of the page data, for example, a "1" write operation is performed on the memory cells C01 and C21 connected to the bit lines BL0 and $BL_2$, and the "0" erase state is maintained in the memory cells C11 and C31 connected to the bit lines $BL_1$ and $BL_3$. To the bit lines BL0 and $BL_2$ on which the "1" write operation is performed, a fourth voltage V4 (an example of "fourth voltage" in the claims) is applied. Here, for example, Vss is constantly applied to the source line SL except during the page erase operation, the page write operation, or the page read operation. Vss here is, for example, 0 V. In addition, for example, Vss is applied to the bit lines $BL_1$ and BL3 that are maintained in the "0" erase state. Under such voltage conditions, the page write operation is performed. Note that a "1" page write operation mechanism corresponds to FIGS. 3AA-3AC.

Next, applied voltages during a page read operation period tRead will be described with reference to the circuit block diagram in FIG. 6A and the operation waveform diagram in FIG. 6B. For example, a case is assumed in which a given row address RA is input to the word line decoder circuit WLD and the plate line decoder circuit PLD. In a case where the row address RA to be input selects WL1 and PL1, a page read operation is performed on the memory cells C01, C11, C21, and C31. Here, since "1" write data is stored in the memory cells C01 and C21, and "0" erase data is stored in the memory cells C11 and C31.

The fifth voltage V5 is applied to the selected plate line PL1, and the fifth voltage V5 is maintained during the page read operation period tRead. The fifth voltage V5 is also applied to the non-selected plate lines PL0, PL2, and PL3. In addition, a sixth voltage V6 (an example of "sixth voltage" in the claims), which is a voltage lower than the second voltage V2, is applied to the selected word line WL1. Here, for example, Vss is constantly applied to the word line WL1 except during the page erase operation, the page write operation, or the page read operation. Thus, Vss is applied to the non-selected word lines WL0, WL2, and $WL_3$. Vss here is, for example, 0 V. In addition, the third voltage V3 is applied to the source line SL. The third voltage V3 here is the ground voltage Vss and is, for example, 0 V.

During the page read operation, a seventh voltage V7 (an example of "seventh voltage" in the claims), which is a voltage lower than the fourth voltage V4, is applied to all the bit lines BL0, $BL_1$, $BL_2$, and $BL_3$. In addition, storage data items in the memory cells C01, C11, C21, and C31 are read to the bit lines BL0, $BL_1$, $BL_2$, and $BL_3$, respectively. Note that a page read operation mechanism corresponds to FIGS. 5A-SAC.

Figure 6B:
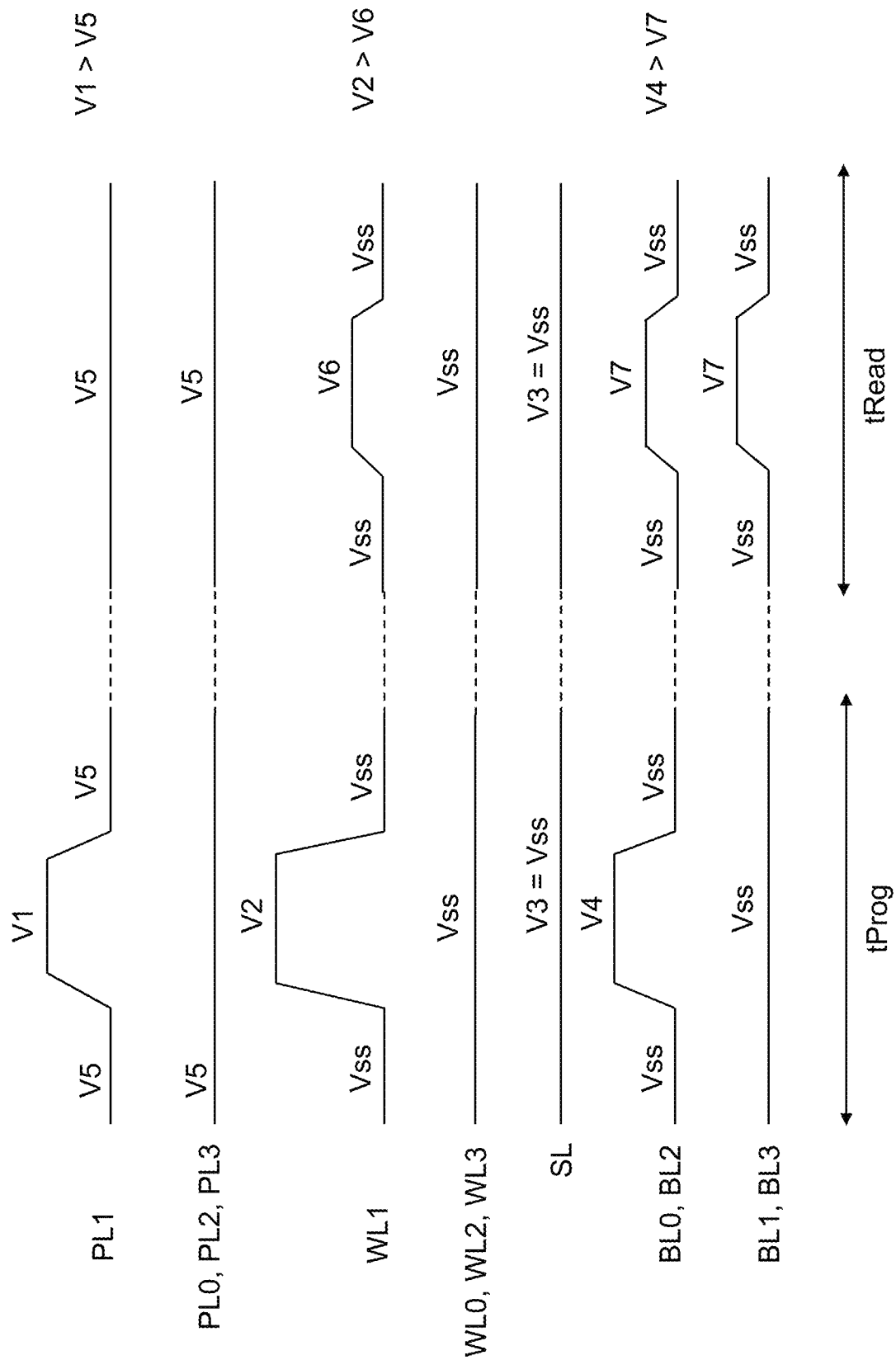
FIG. 6B is a diagram for explaining differences in applied voltages of the SGT-including memory device according to the first embodiment during the page write operation and the page read operation.
Figure 6C:
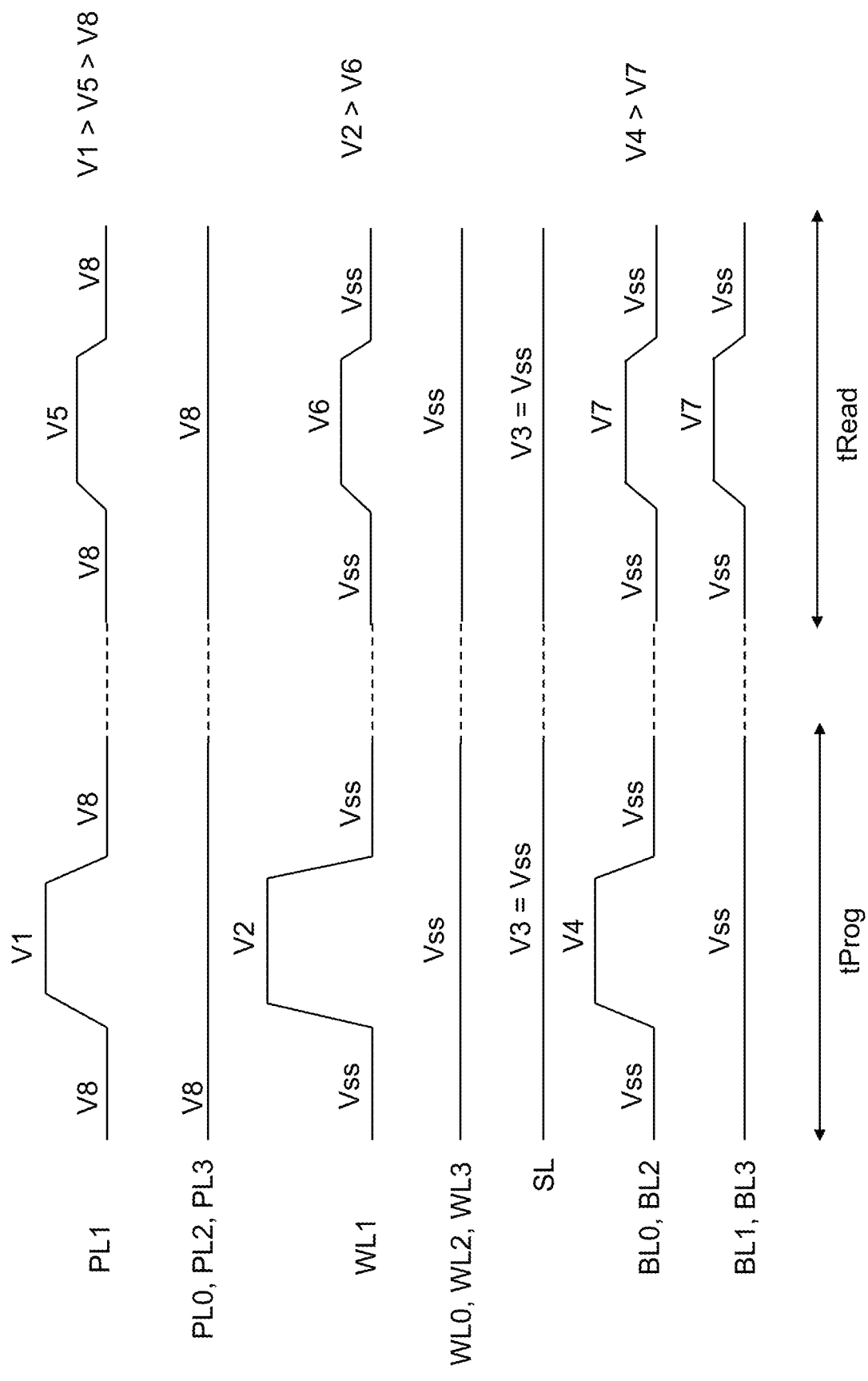
FIG. 6C is a diagram for explaining differences in applied voltages of the SGT-including memory device according to the first embodiment during the page write operation and the page read operation.

In FIG. 6B, a case has been described in which the fifth voltage V5 is constantly applied to the plate line PL1 except during the page erase operation or the page write operation, and the fifth voltage V5 is applied to the non-selected plate lines PL0, PL2, and PL3. In FIG. 6C, a case will be described in which an eighth voltage V8, which is a voltage lower than the fifth voltage V5, is constantly applied to the plate line PL1 except during the page read operation, the page erase operation, or the page write operation, and the eighth voltage V8 is applied to the non-selected plate lines PL0, PL2, and PL3. In this case, an input is performed on the plate line PL1 selected by a clock pulse also during the page read operation.

Figure 6D:
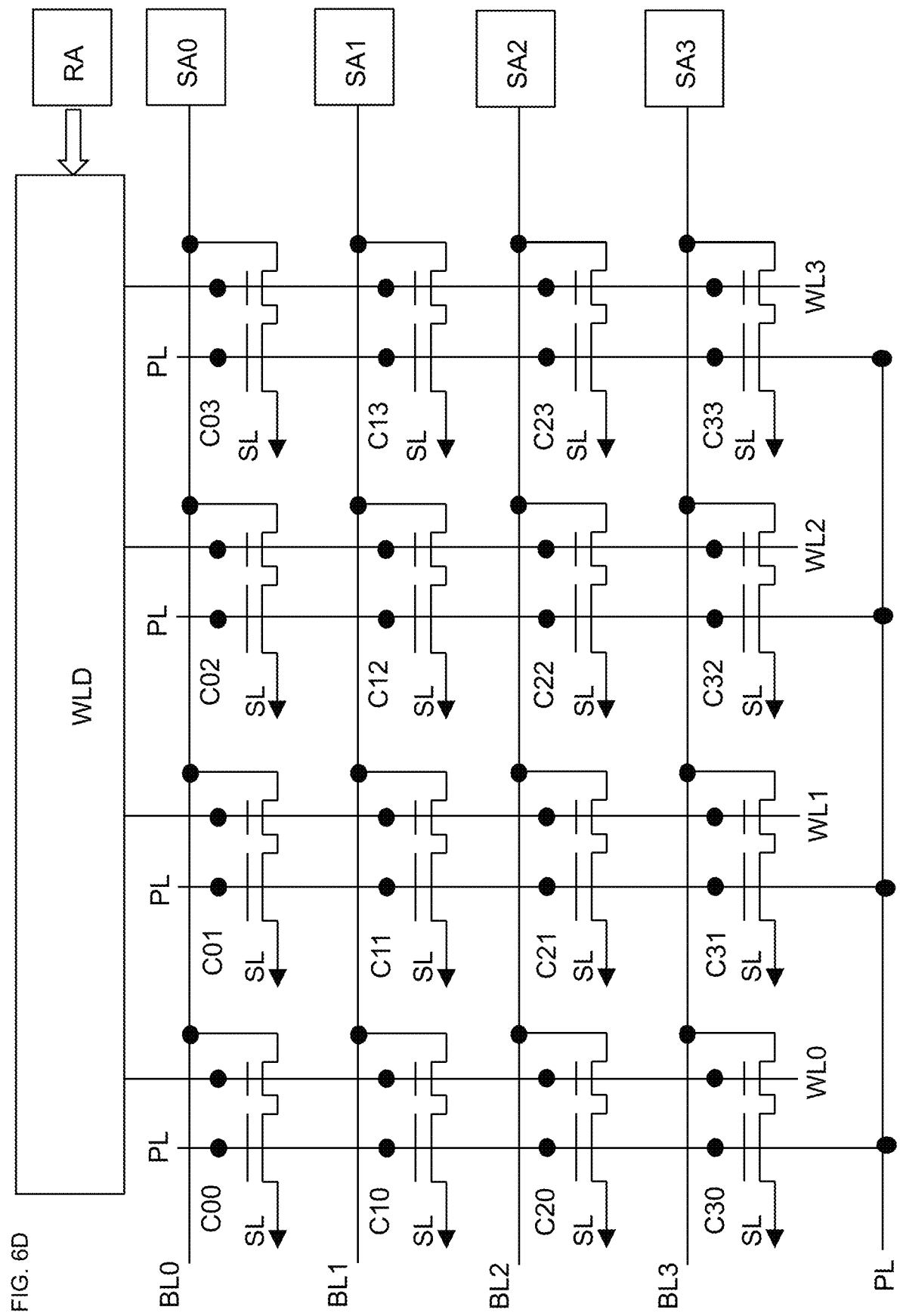
FIG. 6D is a diagram for explaining differences in applied voltages of the SGT-including memory device according to the first embodiment during the page write operation and the page read operation.
Figure 7B:
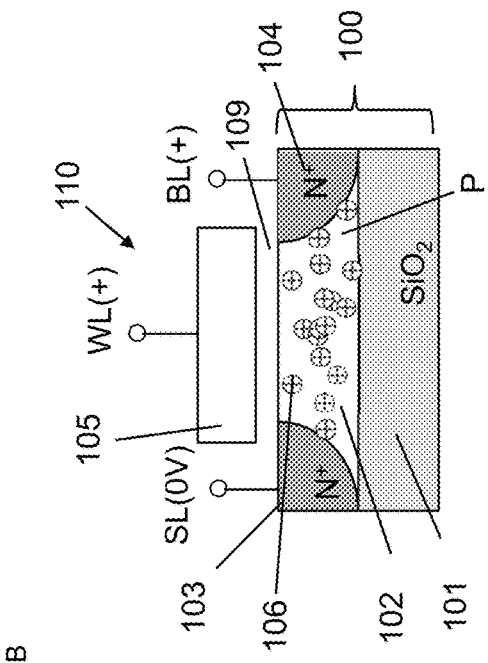
FIGS. 7A, 7B, 7C and 7D are diagrams for explaining a write operation of a DRAM memory cell including no capacitor in the related art.
Figure 7D:
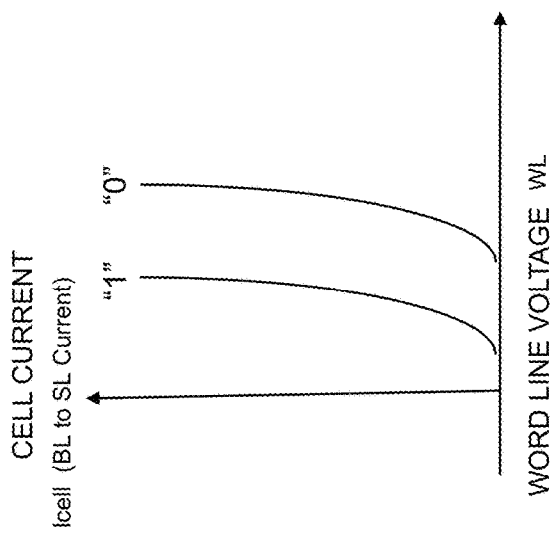
Figure 7A:
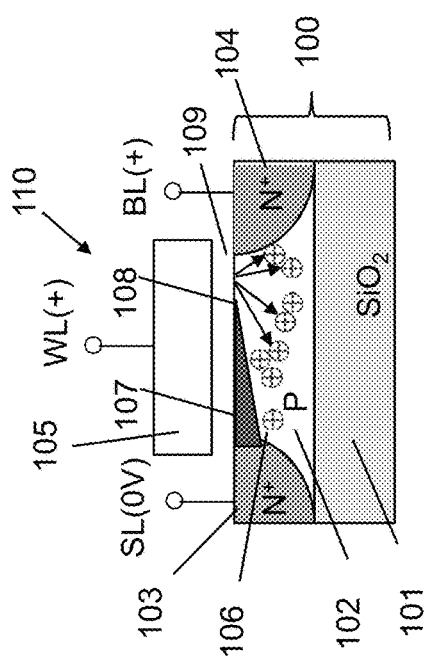
Figure 7C:
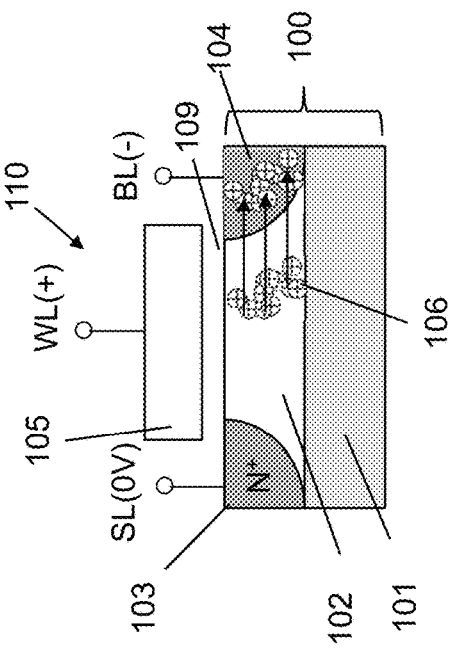
Figure 8A:
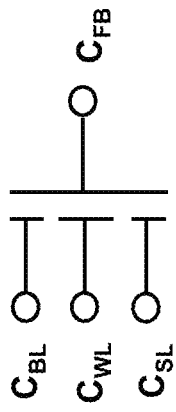
FIGS. 8A and 8B are diagrams for explaining a problem in the operation of the DRAM memory cell including no capacitor in the related art.
Figure 8B:
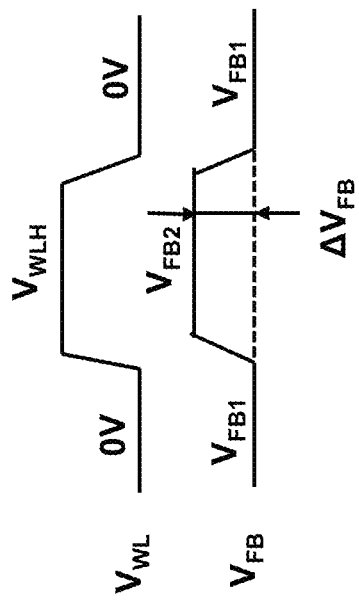
Figure 9C:
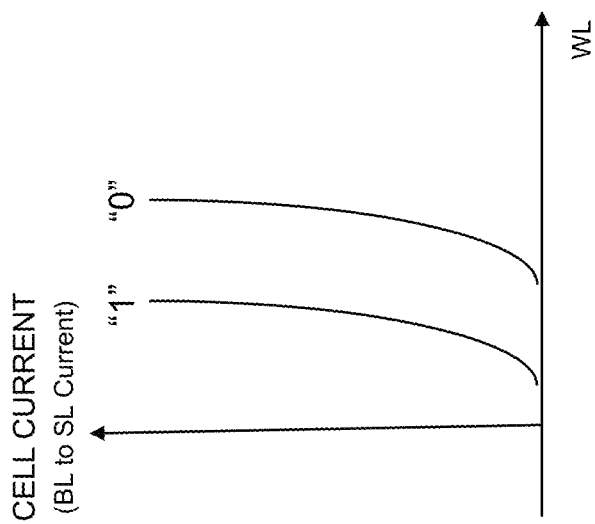
FIGS. 9A, 9B and 9C are diagrams illustrating a read operation of the DRAM memory cell including no capacitor in the related art.
Figure 9A:
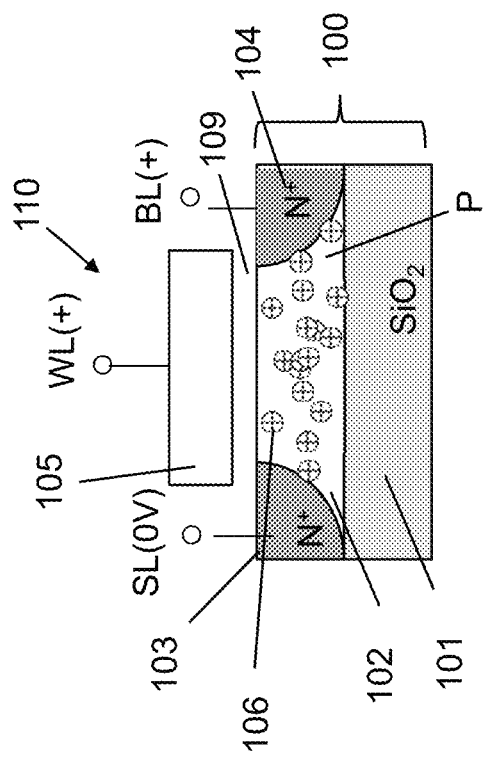
Figure 9B:
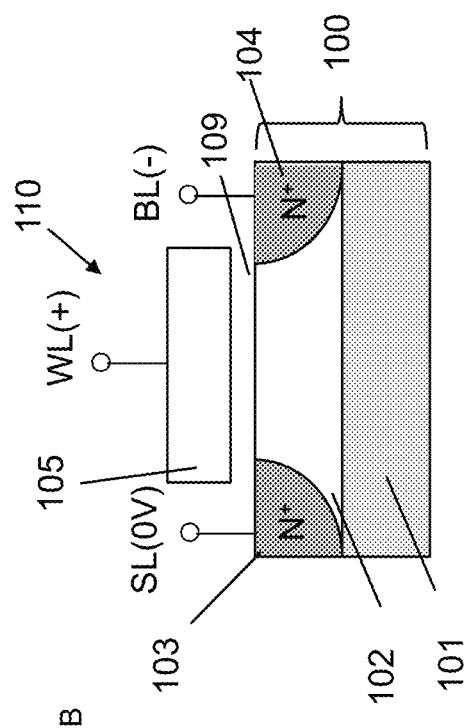

Next, a case will be described in which the plate line PL is common to in the block of a memory array with reference to the circuit block diagram in FIG. 6D and the operation waveform diagram in FIG. 6E. There is an advantage that the process is simplified if the plate line PL is common in the block. In addition, the plate line decoder circuit PLD is unnecessary as illustrated in FIG. 6D. Thus, in the operation waveform diagram in FIG. 6E, the common plate line PL operates at the same time.

The dynamic flash memory operations described in the present embodiment can also be performed when the horizontal cross-sectional shape of the Si pillar 2 in FIG. 1 is circular, elliptical, or rectangular. In addition, a circular, elliptical, or rectangular dynamic flash memory cell may be mixed on the same chip.

In addition, in FIG. 1, a dynamic flash memory element is described by taking an example of an SGT in which the first gate insulating layer 4a and the second gate insulating layer 4b are provided to surround the entire side surface of the Si pillar 2 standing vertically and including the first gate conductor layer 5a and the second gate conductor layer 5b surrounding the entirety of the first gate insulating layer 4a and the second gate insulating layer 4b. As illustrated in the description of the present embodiment, the dynamic flash memory element may have any structure that satisfies the condition that the group of holes 9 generated by the impact ionization phenomenon is retained in the channel region 7. For this, the channel region 7 may have a floating body structure isolated from the substrate. Thus, the above-mentioned dynamic flash memory operations can be performed when, for example, the semiconductor base of the channel region is formed horizontally to the substrate by using a GAA (Gate All Around: refer to, for example, NPL 10) technology and a Nanosheet technology (refer to, for example, NPL 11), which are one type of the SGT. In addition, a device structure (refer to, for example, NPLs 7 to 10) using an SOI (Silicon On Insulator) may also be used. In this device structure, the bottom portion of the channel region is in contact with the insulating layer of the SOI substrate, and other portions of the channel region are surrounded by a gate insulating layer and an element isolation insulating layer. Also in this structure, the channel region has a floating body structure. In this manner, in the dynamic flash memory element provided by the present embodiment, the condition that the channel region has a floating body structure may be satisfied. Furthermore, also with the structure in which a Fin transistor (refer to, for example, NPL 13) is formed on the SOI substrate, as long as the channel region has a floating body structure, the dynamic flash operations can be performed.

In addition, Expressions (1) to (12) in this specification and the drawings are used for explaining the phenomenon in a qualitative manner, and the phenomenon is not limited by these expressions.

Although the reset voltage of the word line WL, the bit line BL, and the source line SL is Vss in the explanation of FIGS. 3AA-3AC, they may be different voltages.

In addition, FIG. 4A illustrates an example of the condition of the page erase operation. For this, if the group of holes 9 in the channel region 7 can be discharged from either or both of the N+ layer 3a and the N+ layer 3b, the voltages to be applied to the source line SL, the plate line PL, the bit line BL, and the word line WL may be changed. In addition, during the page erase operation, a voltage may be applied to the source line SL of a selected page, and the bit line BL may be set to a floating state. Furthermore, during the page erase operation, a voltage may be applied to the bit line BL of a selected page, and the source line SL may be set to a floating state.

In addition, in FIG. 1, in the channel region 7 in a portion surrounded by the insulating layer 6, which is the first insulating layer, in the vertical direction, potential distributions are formed in a continuous manner in the first channel Si layer 7a and the second channel Si layer 7b. Thus, the channel region 7 in the first channel Si layer 7a and the second channel Si layer 7b are continuous in a region surrounded by the insulating layer 6, which is the first insulating layer, in the vertical direction.

In FIG. 1, it is desirable that the length, in the vertical direction, of the first gate conductor layer 5a to which the plate line PL is connected be further made longer than the length, in the vertical direction, of the second gate conductor layer 5b to which the word line WL is connected and that $C_{PL}>C_{WL}$ be satisfied. However, a coupling ratio in capacitive coupling ($C_{WL}/(C_{PL}+C_{WL}+C_{BL}+C_{SL})$) of the word line WL to the channel region 7 is decreased only by adding the plate line PL. As a result, the potential change $\Delta V_{FB}$ in the channel region 7 of the floating body decreases.

As the voltage $V_{PLL}$ of the plate line PL, in each operation mode other than selective erase in a block erase operation, for example, a fixed voltage of 0.5 V may be applied.

Note that the term "cover" in "the gate insulating layer, the gate conductor layer, or the like covers the channel or the like" in this specification and the claims include a case of surrounding the entirety as in the SGT or the GAA, a case of surrounding with part remained as in the Fin transistor, and a case of overlapping a planar object as in a planar transistor.

In FIG. 1, the first gate conductor layer 5a surrounds the entirety of the first gate insulating layer 4a. In contrast, the first gate conductor layer 5a may be in a structure surrounding part of the first gate insulating layer 4a in plan view. In this case, the outside of the first gate insulating layer not covered with the first gate conductor layer 5a may be covered with an insulating layer or a third gate conductor layer that is electrically isolated from the first gate conductor layer. Note that in a case where the third gate conductor layer is provided, the dynamic flash memory operations can be performed by applying a constant voltage or a pulse voltage to the third gate conductor layer. In addition, as described above, by a structure in which the first gate conductor layer 5a surrounds part of the first gate insulating layer 4a in plan view, a large amount of group of holes can be stored in the first channel Si layer 7a.

In FIG. 1, the first gate conductor layer 5a may be divided into two or more portions, and the portions may be operated as conductive electrodes for the plate line synchronously or asynchronously at the same drive voltage or different drive voltages. Similarly, the second gate conductor layer 5b may be divided into two or more portions, and the portions may be operated as conductive electrodes for the word line synchronously or asynchronously at the same drive voltage or different drive voltages. This also enables the dynamic flash memory operations to be performed. In a case where the first gate conductor layer 5a is divided into two or more portions, at least one portion of the divided first gate conductor layer 5a plays a role of the above first gate conductor layer 5a. Also for the divided second gate conductor layers 5b, at least one portion of the divided second gate conductor layer 5b plays a role of the above second gate conductor layer 5b.

In addition, in FIG. 1, the first gate conductor layer 5a may be connected to the word line WL, and the second gate conductor layer 5b may be connected to the plate line PL. This also enables the above dynamic flash memory operations to be performed.

In addition, the condition of the voltages to be applied to the bit line BL, the source line SL, the word line WL, and the plate line PL and the voltage of the floating body are examples for performing basic operations of the erase operation, the write operation, and the read operation, and other voltage conditions may be used as long as the basic operations in the present invention can be performed.

The present embodiment provides the following features.

(Feature 1)

In the dynamic flash memory cell according to the present embodiment, the $N^+$ layers $3a$ and $3b$ serving as the source and the drain, the channel region 7, the first gate insulating layer $4a$, the second gate insulating layer $4b$, the first gate conductor layer $5a$, and the second gate conductor layer $5b$ are formed in a pillar shape as a whole. In addition, the $N^+$ layer $3a$ serving as the source, the $N^+$ layer $3b$ serving as the drain, the first gate conductor layer $5a$, and the second gate conductor layer $5b$ are respectively connected to the source line SL, the bit line BL, the plate line PL, and the word line WL. The structure has a feature that the gate capacitance of the first gate conductor layer $5a$ to which the plate line PL is connected is made larger than the gate capacitance of the second gate conductor layer $5b$ to which the word line WL is connected. In this dynamic flash memory cell, the first gate conductor layer and the second gate conductor layer are stacked in the vertical direction. Thus, also with the structure in which the gate capacitance of the first gate conductor layer $5a$ to which the plate line PL is connected is made larger than the gate capacitance of the second gate conductor layer $5b$ to which the word line WL is connected, the memory cell area is not increased in plan view. This enables a higher performance and a higher degree of integration of the dynamic flash memory cell at the same time.

(Feature 2)

The voltage applied to the plate line PL of the dynamic flash memory cell according to the first embodiment of the present invention is made lower during the page read operation period tRead than during the page write operation period tProg. As a result, in accordance with a decrease in the electric field applied to the channel region 7, read disturb (Read Disturb) in a case where page reading is repeated can be significantly improved. That is, the group of holes 9 that is generated by the impact ionization phenomenon in "1" writing and stored in the channel region 7 can be significantly suppressed from being discharged from the source $N^+$ layer $3a$ and the drain $N^+$ layer $3b$ during the page read operation. This enables a memory device using a high-reliability semiconductor element, by which a long-time data retention characteristic (Retention characteristic) is obtained.

(Feature 3)

If the voltages of the word line WL and the bit line BL are made lower at the same time in addition to making the voltage applied to the plate line PL lower during the page read operation period tRead than during the page write operation period tProg described in (Feature 2), more significant effects can be obtained. That is, the voltages of the word line WL and the bit line BL are also made lower during the page read operation period tRead than during the page write operation period tProg. This enables a memory device using a higher-reliability semiconductor element.

(Feature 4)

Focusing on the role of the first gate conductor layer $5a$ to which the plate line PL is connected in the dynamic flash memory cell according to the first embodiment of the present invention, when the dynamic flash memory cell performs a write or read operation, the voltage of the word line WL swings. At this time, the plate line PL has a function of decreasing the capacitive coupling ratio between the word line WL and the channel region 7. As a result, the influence of a change in the voltage of the channel region 7 when the voltage of the word line WL swings can be significantly suppressed. Thus, the difference between the threshold voltages of the transistor region of the word line WL that indicates logical "0" and "1" can be increased. This leads to an increase in the operation margin of the dynamic flash memory cell. Furthermore, in data reading, the voltage applied to the first gate conductor layer $5a$ connected to the plate line PL is set to be higher than the threshold voltage at the time of logical storage data "1" and lower than the threshold voltage at the time of logical storage data "0" to thereby obtain the characteristic that a current does not flow even when the voltage of the word line WL is increased. This leads to a further increase in the operation margin of the dynamic flash memory cell.

OTHER EMBODIMENTS

Although the Si pillar is formed in the present invention, a semiconductor pillar formed of a semiconductor material other than Si may also be used. The same applies to other embodiments according to the present invention.

In a vertical NAND-type flash memory circuit, a plurality of memory cells are formed in the vertical direction, the memory cells each being constituted by, a semiconductor pillar as the channel and, around the semiconductor pillar, a tunnel oxide layer, a charge storage layer, an interlayer insulating layer, and a control conductor layer. In the semiconductor pillar of these memory cells, there are a source line impurity layer corresponding to a source, and a bit line impurity layer corresponding to a drain, at both ends. In addition, when one of both sides of a single memory cell serves as a source, the other serves as a drain. Thus, the vertical NAND-type flash memory circuit is one type of an SGT circuit. Therefore, the present invention is also applicable to a circuit in which a NAND-type flash memory circuit is mixed.

Furthermore, in "1" writing, by an impact ionization phenomenon using a gate induced drain leakage (GIDL: Gate Induced Drain Leakage) current described in NPL 10, electron-hole pairs may be generated, and the floating body FB may be filled with the generated group of holes. The same applies to other embodiments according to the present invention.

In addition, the dynamic flash memory operations are performed also in a structure in which the polarities of the conductivity types of the $N^+$ layers $3a$ and $3b$ and the P-layer Si pillar 2 in FIG. 1 are reversed. In this case, in the N-type Si pillar 2, the majority carriers are electrons. Therefore, a group of electrons generated by impact ionization is stored in the channel region 7, and the "1" state is set.

Various embodiments and modifications of the present invention are possible without departing from the broad spirit and scope of the present invention. The embodiments described above are illustrative examples of the present invention and do not limit the scope of the present invention. The embodiments and modifications can be appropriately combined. Furthermore, some of constituent features of the above embodiments may be omitted as required, and such embodiments still fall within the technical idea of the present invention.

INDUSTRIAL APPLICABILITY

According to the memory device using the semiconductor element according to the present invention, a high-density and high-performance dynamic flash memory which is a memory device using an SGT can be obtained.

The invention claimed is:

1. A semiconductor element memory device comprising a plurality of pages in columns, each of the pages being made of a plurality of memory cells arranged in rows, wherein
   each of the memory cells included in the page includes
      a semiconductor base on a substrate, the semiconductor base standing vertically or extending horizontally to the substrate,
      a first impurity layer and a second impurity layer at both ends of the semiconductor base,
      a first gate insulating layer that surrounds part or all of a side surface of the semiconductor base between the first impurity layer and the second impurity layer and that is in contact with or close to the first impurity layer,
      a second gate insulating layer that surrounds part or all of the side surface of the semiconductor base, that is connected to the first gate insulating layer, and that is in contact with or close to the second impurity layer,
      a first gate conductor layer that covers part or all of the first gate insulating layer,
      a second gate conductor layer that covers the second gate insulating layer, and
      a channel semiconductor layer in which the semiconductor base is covered with the first gate insulating layer and the second gate insulating layer,
   in each of the memory cells,
   during a page write operation, a first voltage is applied to the first gate conductor layer, a second voltage is applied to the second gate conductor layer, a third voltage is applied to the first impurity layer, a fourth voltage is applied to the second impurity layer, a group of holes generated by an impact ionization phenomenon is retained in an inside of the channel semiconductor layer, and a voltage of the channel semiconductor layer is set to a first data retention voltage that is higher than either or both of voltages of the first impurity layer and the second impurity layer,
   during a page erase operation, the voltages to be applied to the first gate conductor layer, the second gate conductor layer, the first impurity layer, and the second impurity layer are controlled to discharge the group of holes from the inside of the channel semiconductor layer in each of all the memory cells constituting the page, through either or both of the first impurity layer and the second impurity layer, and the voltage of the channel semiconductor layer is set to a second data retention voltage that is lower than the first data retention voltage, and
   during a page read operation, in each of all the memory cells constituting the page, a fifth voltage is applied to the first gate conductor layer, a sixth voltage is applied to the second gate conductor layer, the third voltage is applied to the first impurity layer, and a seventh voltage is applied to the second impurity layer, and
   the fifth voltage is lower than the first voltage.

2. The semiconductor element memory device according to claim 1, wherein the sixth voltage is lower than the second voltage.

3. The semiconductor element memory device according to claim 1, wherein the seventh voltage is lower than the fourth voltage.

4. The semiconductor element memory device according to claim 1, wherein the third voltage is a ground voltage.

5. The semiconductor element memory device according to claim 1, wherein a first gate capacitance between the first gate conductor layer and the channel semiconductor layer is formed to be larger than a second gate capacitance between the second gate conductor layer and the channel semiconductor layer.

6. A semiconductor element memory device comprising a block in which the plurality of pages of the memory device according to claim 1 are arranged, wherein
   in each of the memory cells included in the plurality of pages, the first impurity layer is connected to a source line, the second impurity layer is connected to a bit line, one of the first gate conductor layer and the second gate conductor layer is connected to a word line, and the other is connected to a first drive control line,
   the source line is connected across the semiconductor bases in the block, and
   with voltages applied to the source line, the bit line, the first drive control line, and the word line, the page erase operation for discharging the group of holes in all the semiconductor bases of the page that is selected in the block is performed.

7. The semiconductor element memory device according to claim 6, wherein the voltage applied to the first drive control line during the page read operation is lower than the voltage applied to the first drive control line during the page write operation, the voltage applied to the word line during the page read operation is lower than the voltage applied to the word line during the page write operation, and the voltage applied to the bit line during the page read operation is lower than the voltage applied to the bit line during the page write operation.

8. The semiconductor element memory device according to claim 6, wherein the voltage applied to the source line is the ground voltage during the page write operation and the page read operation.

9. The semiconductor element memory device according to claim 1, wherein the first gate conductor layer is isolated into two conductor layers that surround the first gate insulating layer in plan view.

10. The semiconductor element memory device according to claim 7, wherein the voltage applied to the source line is the ground voltage during the page write operation and the page read operation.

11. A semiconductor element memory device comprising a block in which the plurality of pages of the memory device according to claim 2 are arranged, wherein
    in each of the memory cells included in the plurality of pages, the first impurity layer is connected to a source line, the second impurity layer is connected to a bit line, one of the first gate conductor layer and the second gate conductor layer is connected to a word line, and the other is connected to a first drive control line,
    the source line is connected across the semiconductor bases in the block, and
    with voltages applied to the source line, the bit line, the first drive control line, and the word line, the page erase operation for discharging the group of holes in all the semiconductor bases of the page that is selected in the block is performed.

12. A semiconductor element memory device comprising a block in which the plurality of pages of the memory device according to claim 3 are arranged, wherein
    in each of the memory cells included in the plurality of pages, the first impurity layer is connected to a source line, the second impurity layer is connected to a bit line, one of the first gate conductor layer and the second gate conductor layer is connected to a word line, and the other is connected to a first drive control line, the source line is connected across the semiconductor bases in the block, and with voltages applied to the source line, the bit line, the first drive control line, and the word line, the page erase operation for discharging the group of holes in all the semiconductor bases of the page that is selected in the block is performed.

13. A semiconductor element memory device comprising a block in which the plurality of pages of the memory device according to claim 4 are arranged, wherein in each of the memory cells included in the plurality of pages, the first impurity layer is connected to a source line, the second impurity layer is connected to a bit line, one of the first gate conductor layer and the second gate conductor layer is connected to a word line, and the other is connected to a first drive control line, the source line is connected across the semiconductor bases in the block, and with voltages applied to the source line, the bit line, the first drive control line, and the word line, the page erase operation for discharging the group of holes in all the semiconductor bases of the page that is selected in the block is performed.

14. A semiconductor element memory device comprising a block in which the plurality of pages of the memory device according to claim 5 are arranged, wherein in each of the memory cells included in the plurality of pages, the first impurity layer is connected to a source line, the second impurity layer is connected to a bit line, one of the first gate conductor layer and the second gate conductor layer is connected to a word line, and the other is connected to a first drive control line, the source line is connected across the semiconductor bases in the block, and with voltages applied to the source line, the bit line, the first drive control line, and the word line, the page erase operation for discharging the group of holes in all the semiconductor bases of the page that is selected in the block is performed.

* * * * *